United States Patent
Yu et al.

(10) Patent No.: US 11,610,866 B2
(45) Date of Patent: Mar. 21, 2023

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventors: Chen-Hua Yu, Hsinchu (TW); Wen-Chih Chiou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 30 days.

(21) Appl. No.: 17/227,378

(22) Filed: Apr. 12, 2021

(65) Prior Publication Data

US 2021/0257339 A1 Aug. 19, 2021

Related U.S. Application Data

(62) Division of application No. 16/171,343, filed on Oct. 25, 2018, now Pat. No. 10,978,424.

(Continued)

(51) Int. Cl.
  *H01L 25/065* (2006.01)
  *H01L 23/532* (2006.01)
  (Continued)

(52) U.S. Cl.
  CPC ........ *H01L 25/0657* (2013.01); *H01L 21/563* (2013.01); *H01L 21/8221* (2013.01);
  (Continued)

(58) Field of Classification Search
  CPC ..... H01L 21/56; H01L 21/563; H01L 21/565; H01L 21/8221; H01L 23/13; H01L 23/28; H01L 23/31; H01L 23/3114; H01L 23/3128; H01L 23/3135; H01L 23/3157; H01L 23/3185; H01L 23/53295;
  (Continued)

(56) References Cited

U.S. PATENT DOCUMENTS 9,000,584 B2 4/2015 Lin et al.
9,048,222 B2 6/2015 Hung et al.
(Continued)

OTHER PUBLICATIONS

"Office Action of Taiwan Counterpart Application", dated Mar. 10, 2022, p. 1-p. 10.

*Primary Examiner* — Cheung Lee
(74) *Attorney, Agent, or Firm* — JCIPRNET

(57) ABSTRACT

A semiconductor device including a first integrated circuit component, a second integrated circuit component, a third integrated circuit component, and a dielectric encapsulation is provided. The second integrated circuit component is stacked on and electrically coupled to the first integrated circuit component, and the third integrated circuit component is stacked on and electrically coupled to the second integrated circuit component. The dielectric encapsulation is disposed on the second integrated circuit component and laterally encapsulating the third integrated circuit component, where outer sidewalls of the dielectric encapsulation are substantially aligned with sidewalls of the first and second integrated circuit components. A manufacturing method of the above-mentioned semiconductor device is also provided.

20 Claims, 22 Drawing Sheets

Related U.S. Application Data

(60) Provisional application No. 62/714,086, filed on Aug. 3, 2018.

(51) Int. Cl.
*H01L 23/31* (2006.01)
*H01L 23/00* (2006.01)
*H01L 21/822* (2006.01)
*H01L 25/00* (2006.01)
*H01L 23/538* (2006.01)
*H01L 21/56* (2006.01)

(52) U.S. Cl.
CPC ...... *H01L 23/3114* (2013.01); *H01L 23/3128* (2013.01); *H01L 23/3185* (2013.01); *H01L 23/5384* (2013.01); *H01L 23/53295* (2013.01); *H01L 24/32* (2013.01); *H01L 25/50* (2013.01); *H01L 2224/0401* (2013.01)

(58) Field of Classification Search
CPC ..... H01L 23/5384; H01L 24/31; H01L 24/32; H01L 24/33; H01L 24/80; H01L 25/0657; H01L 25/0756; H01L 25/50; H01L 2224/0401
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,117,938 B2 | 8/2015 | Park et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2014/0084456 A1* | 3/2014 | Kang ............... H01L 25/50 257/737 |
| 2017/0345798 A1 | 11/2017 | Yu et al. |
| 2017/0358562 A1 | 12/2017 | Banna et al. |
| 2018/0012862 A1 | 1/2018 | Yu et al. |

* cited by examiner

SEMICONDUCTOR DEVICE AND MANUFACTURING METHOD THEREOF

CROSS-REFERENCE TO RELATED APPLICATION

This application is a divisional application of U.S. application Ser. No. 16/171,343, filed on Oct. 25, 2018. The prior application Ser. No. 16/171,343 claims the priority benefits of U.S. provisional application Ser. No. 62/714,086, filed on Aug. 3, 2018. The entirety of each of the above-mentioned patent applications is hereby incorporated by reference herein and made a part of this specification.

BACKGROUND

Currently, the three-dimensional integrated circuit (3D-IC) components are widely developed in semiconductor packaging in which multiple semiconductor dies are stacked upon one another, such as package-on-package (PoP) and system-in-package (SiP) packaging techniques. Some of the benefits of 3D-IC components, for example, include exhibiting a smaller footprint, reducing power consumption by reducing the lengths of signal interconnects, and improving yield and reducing fabrication cost. As semiconductor technologies further advance, bonding technology for chip-to-wafer bonding or wafer-to-wafer bonding is utilized in fabrication of 3D-IC components. For example, in wafer-to-wafer bonding technology, various methods have been developed to bond two package components (such as wafers) together. Hybrid bonding is one type of bonding technology for 3D-ICs, where two semiconductor wafers are bonded together using a hybrid bonding technique.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
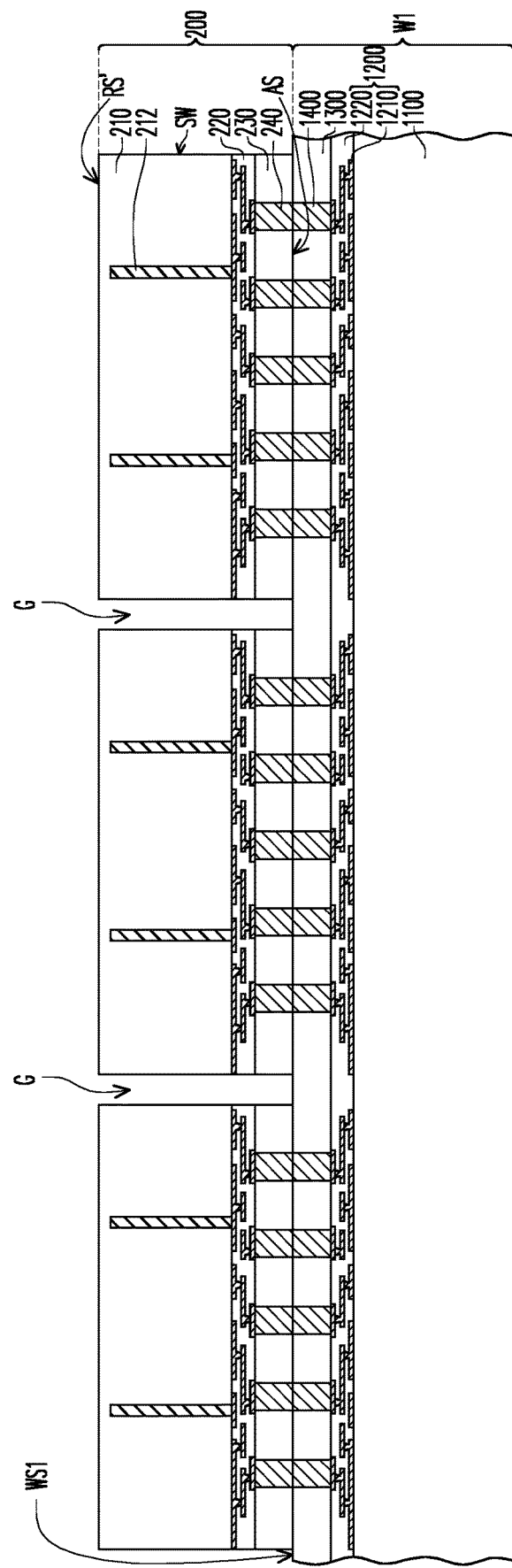
FIGS. 1 through 7 are schematic cross-sectional views showing various stages in a manufacturing method of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1 through 7 are schematic cross-sectional views showing various stages in a manufacturing method of a semiconductor device according to some exemplary embodiments of the present disclosure. Referring to FIG. 1, a plurality of semiconductor dies or integrated circuit components 200 are bonded with a first semiconductor wafer W1. The bonding may be performed at the die-to-wafer level. Alternatively, the bonding may be performed at the die-to-die level or wafer-to-wafer level as will be described later herein.

In some embodiments, the first semiconductor wafer W1 includes a first substrate 1100, a first interconnection layer 1200 formed over the first substrate 1100, a first dielectric layer 1300 formed over the first interconnection layer 1200, and a plurality of first conductive connectors 1400 embedded in the first dielectric layer 1300. The first substrate 1100 may be a semiconductor substrate, such as a bulk semiconductor or the like, which may be doped (e.g., with a p-type or an n-type dopant) or undoped. The first substrate 1100 may be a silicon wafer. Other suitable substrates, such as a multi-layered substrate (e.g., a semiconductor-on-insulator (SOI) substrate), a gradient substrate, or the like, may also be used. The semiconductor material of the first substrate 1100 may include silicon, germanium, a compound semiconductor (e.g., silicon carbide, gallium arsenic, gallium phosphide, indium phosphide, indium arsenide, etc.), an alloy semiconductor, or combinations thereof. A wide variety of electrical components (e.g., transistors, capacitors, resistors, combinations of these, and the like) may be used to generate the structural and functional requirements of the design for the first substrate 1100. In some embodiments, the first substrate 1100 is free of through semiconductor vias depending on the design requirements. In alternative embodiments, through semiconductor vias are formed in the semiconductor substrate of wafer as will be described later herein. In some embodiments, the first interconnection layer 1200 includes a plurality of first conductive patterns 1210 embedded in a first dielectric material 1220. The first interconnection layer 1200 may be referred to as the inter-metallization dielectric (IMD) layer(s). In some embodiments, the first conductive conductors 1400 are embedded in the first dielectric layer 1300. The first conductive conductors 1400 may include conductive pads electrically coupled to the first substrate 1100 through the first interconnection layer 1200. In some embodiments, the material of the first conductive conductors 1400 includes metallic material (e.g., a metal or a metal alloy such as copper, silver, gold, tungsten, cobalt, aluminum, or alloys thereof). The first dielectric layer 1300 may provide a degree of protection for the underlying structures. For example, the first dielectric layer 1300 can be formed of silicon oxide, silicon nitride, silicon oxy-nitride, low-k dielectrics, combinations thereof, or the like. In some embodiments, at least a portion of the first conductive conductors 1400 are revealed by the first dielectric layer 1300. The top surfaces of the first conductive conductors 1400 and the top surface of the first dielectric layer 1300 may be substantially level. In some embodiments, the top surfaces of the first conductive conductors 1400 and the top surface of the first dielectric layer 1300 are collectively referred to as a first wafer bonding surface WS1.

The integrated circuit components 200 may include logic dies (e.g., central processing unit (CPU), graphics processing unit (GPU), microcontroller, etc.), memory dies (e.g., dynamic random access memory (DRAM) dies, static random access memory (SRAM) dies, etc.), power management dies (e.g., power management integrated circuit (PMIC) dies), radio frequency (RF) dies, sensor dies, micro-electro-mechanical-system (MEMS) dies, the like, or a combination thereof. In certain embodiments, the processing, memory, and/or electronic control functionality may be integrated on the same integrated circuit component. In some embodiments, each integrated circuit component 200 includes a semiconductor substrate 210, at least one through semiconductor via 212 formed in the semiconductor substrate 210, an interconnection structure 220 formed over the semiconductor substrate 210 and electrically connected to the through semiconductor vias 212, a dielectric layer 230 formed over the interconnection structure 220, and a plurality of die connectors 240 embedded in the dielectric layer 230 and electrically connected to the interconnection structure 220. It should be noted that the number of through semiconductor vias 212 merely serves as an illustrative example, and the disclosure is not limited thereto.

For example, the semiconductor substrate 210 of the integrated circuit components 200 may be a silicon substrate including active components (e.g., transistors or the like) and/or passive components (e.g., resistors, capacitors, inductors or the like) formed therein; the die connectors 240 may include aluminum pads, copper pads, or other suitable metal pads; and the dielectric layer 230 may be a silicon oxide layer, a silicon nitride layer, a silicon oxy-nitride layer, or a dielectric layer formed by other suitable dielectric materials. As referred to herein, the through semiconductor vias 212 of the integrated circuit components 200 are not intended to be limited to any particular type of electrically conducting material or any particular method of fabrication. Electrically conducting pillars, whether solid or hollow, or other electrically interconnecting structures, that can provide electrical connection and go through in a thickness direction may be considered as the through semiconductor vias 212. The interconnection structure 220 of the integrated circuit components 200 formed over the semiconductor substrate 210 is designed to connect the various electrical components to form functional circuitry. For example, the interconnection structure 220 is formed of alternating layers of dielectric material and conductive material and may be formed through any suitable process (e.g., deposition, damascene, dual damascene, etc.).

In some embodiments, the die connectors 240 of the integrated circuit components 200 including conductive pads are partially revealed by the openings of the dielectric layer 230. In some embodiments, top surfaces of the die conductors 240 and a top surface of the dielectric layer 230 are collectively referred to as an active surface AS of each integrated circuit component 200. For example, each integrated circuit component 200 may include the active surface AS, a rear surface RS' opposite to the active surface AS, and the sidewalls SW connected to the active surface AS and the rear surface RS'. In some embodiments, the through semiconductor vias 212 are not revealed by the rear surface RS' at this stage. In some embodiments, the top surfaces of the die conductors 240 and the top surface of the dielectric layer 230 may be substantially located at the same level height to provide an appropriate active surface AS for a subsequent bonding process.

In some embodiments, the integrated circuit components 200 are picked-and-placed onto the first wafer bonding surface WS1 of the first semiconductor wafer W1. In some embodiments, a gap G is formed between two adjacent integrated circuit components 200. In some alternative embodiments, some of the various integrated circuit components 200 may be directly adjacent one another such that no gap is formed between the integrated circuit components 200. In other words, the integrated circuit components 200 may be spaced apart or immediately disposed side by side. In some embodiments, the integrated circuit components 200 and the first semiconductor wafer W1 are bonded in a face-to-face alignment. For example, the active surface AS of each integrated circuit component 200 and the first wafer bonding surface WS1 of the first semiconductor wafer W1 may be face each other and may be in physical contact with each other. In some embodiments, the first conductive connectors 1400 of the first semiconductor wafer W1 are substantially aligned and in contact with the die conductors 240 of the integrated circuit components 200. For example, the center of the first conductive connectors 1400 may be substantially positioned to the center of the die conductors 240. The integrated circuit components 200 and the first semiconductor wafer W1 are bonded using hybrid bonding, fusion bonding, direct bonding, dielectric bonding, metal bonding, solder joints, or other applicable techniques, such that the integrated circuit components 200 are electrically connected to the first semiconductor wafer W1.

For example, the dielectric layers 230 of the integrated circuit components 200 are bonded to the first dielectric layer 1300 of the first semiconductor wafer W1 using direct dielectric-to-dielectric bonding, and the die connectors 240 of each integrated circuit components 200 are bonded to the first conductive connectors 1400 of the first semiconductor wafer W1 using direct metal-to-metal bonding. In such embodiments, covalent bonds are formed with oxide layers, such as the dielectric layers 230 of the integrated circuit components 200. In some embodiments, before performing the bonding process, a surface treatment may be performed on the integrated circuit components 200. Next, a pre-bonding process may be performed to align the integrated circuit components 200 with the first semiconductor wafer W1. For example, the alignment of the integrated circuit components 200 and the first semiconductor wafer W1 may be achieved using optical sensing, alignment marks, or other applicable techniques. Subsequently, the integrated circuit components 200 and the first semiconductor wafer W1 may be pressed against together to form weak bonds at the interface therebetween. For example, a pressing force may be applied to press the integrated circuit components 200 and the first semiconductor wafer W1 against one another. In some embodiments, the pre-bonding step may be performed at the room temperature. In alternative embodiments, higher temperatures may be used during the pre-bonding step.

After the pre-bonding process, the integrated circuit components 200 and the first semiconductor wafer W1 are treated to strengthen the weak bonds using, for example, an annealing process, other heating techniques, or the like. For example, during the annealing process, OH bonds in the dielectric layers 230 of the integrated circuit components 200 and the first dielectric layer 1300 of the first semiconductor wafer W1 may break to form the strong bonds between the integrated circuit components 200 and the first semiconductor wafer W1, and hence the integrated circuit components 200 and the first semiconductor wafer W1 are bonded to one another through, for example, fusion bonds or Van Der Waals force. In some embodiments, during the hybrid bonding, the metal (e.g., copper) in the die connectors 240 of the integrated circuit components 200 and the first conductive connectors 1400 of the first semiconductor wafer W1 may diffuse to each other, so that metal-to-metal bonds also occurs therebetween. Afterwards, the resulting bonds between the integrated circuit components 200 and the first semiconductor wafer W1 are hybrid bonds. The dimensions of the die connectors 240 of the integrated circuit components 200 and the first conductive connectors 1400 of the first semiconductor wafer W1 may be similar. For example, widths of the die connectors 240 may be substantially the same as width of the corresponding first conductive connectors 1400 so that after bonding, the first conductive connectors 1400 and the corresponding die connectors 240 are pitch-matched. In alternative embodiments, the dimensions of the die connectors 240 of the integrated circuit components 200 and the corresponding first conductive connectors 1400 of the first semiconductor wafer W1 are different. The dimensions of the die connectors 240 of the integrated circuit components 200 may be greater than that of the corresponding first conductive connectors 1400 of the first semiconductor wafer W1. In alternative embodiments, the dimensions of the first conductive connectors 1400 of the first semiconductor wafer W1 may be greater than that of the corresponding die connectors 240.

Figure 2:
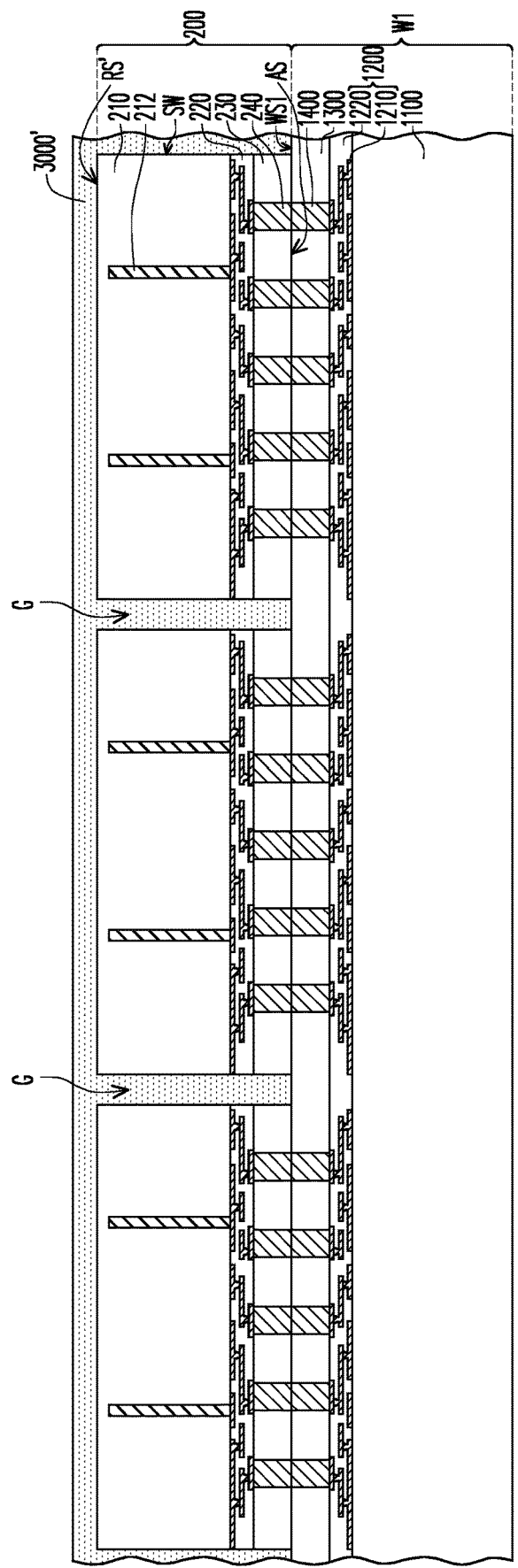
Figure 3:
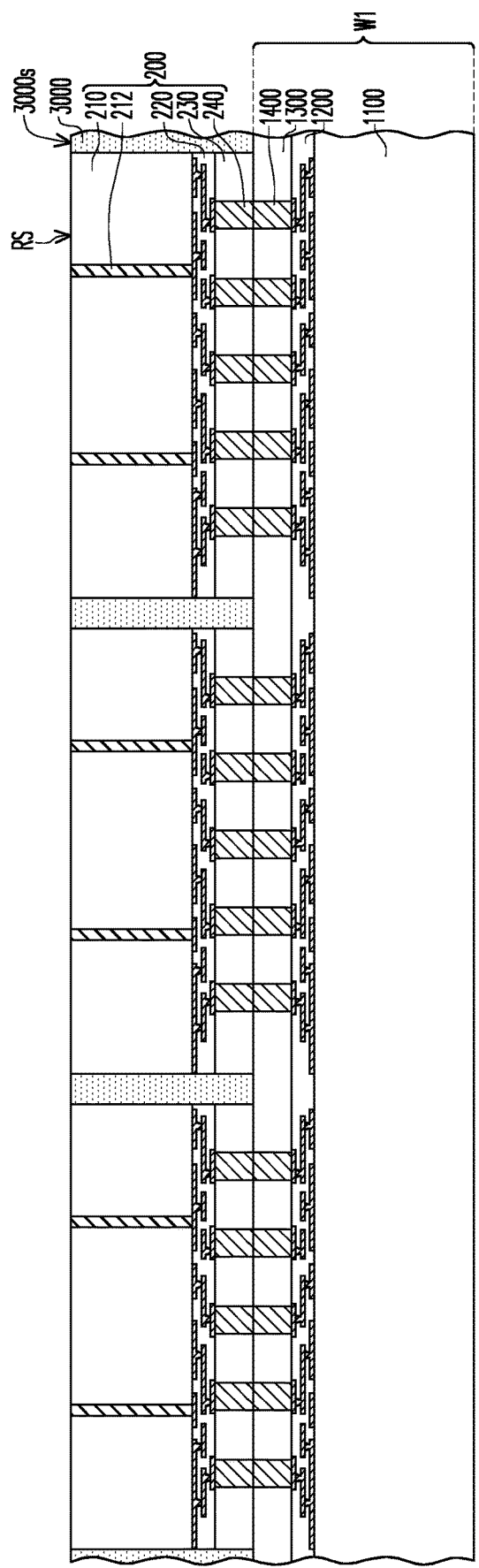

Referring to FIGS. 2 and 3, after bonding the integrated circuit components 200 with the first semiconductor wafer W1, a dielectric encapsulation layer 3000 is formed on the first semiconductor wafer W1 to laterally encapsulate the integrated circuit components 200. In some embodiments, a dielectric material layer 3000' is formed to cover the first semiconductor wafer W1 and each integrated circuit component 200. For example, the dielectric material layer 3000' is formed over the first wafer bonding surface WS1 of the first semiconductor wafer W1 and wraps the integrated circuit components 200. The dielectric material layer 3000' may fill the gaps G between the adjacent integrated circuit components 200 so that the dielectric material layer 3000' covers the sidewalls SW and the rear surfaces RS' of the integrated circuit components 200. In some embodiments, the dielectric material layer 3000' includes inorganic material (e.g., silicon dioxide, Si—O—N, Si—C—N, Si—C—O, or the like), organic material (e.g., epoxy, polyimide (PI), polybenzoxazole (PBO), or the like), or the mixture of inorganic and organic materials (e.g., the mixture of silicon dioxide and epoxy, or the like). The dielectric material layer 3000' may be referred to as "gap-fill dielectric". In alternative embodiments, the dielectric material layer 3000' includes a molding compound, a molding underfill (MUF), a resin, or the like. The dielectric material layer 3000' may be formed through chemical vapor deposition (CVD), plasma-enhanced chemical vapor deposition (PECVD), atomic layer deposition (ALD), or other suitable techniques.

Subsequently, the dielectric material layer 3000' is partially removed to reveal the integrated circuit components 200 so as to form the dielectric encapsulation 3000. For example, after forming the dielectric material layer 3000', a planarization process may be performed on the dielectric material layer 3000'. In some embodiments, the planarization process includes a mechanical grinding process and/or a chemical mechanical polishing (CMP) process, or other applicable processes. In some embodiments, the planarization process is performed on the dielectric material layer 3000' and the rear surfaces RS of the integrated circuit components 200, thereby obtaining a substantially planar surface topography. For example, the dielectric material layer 3000' is grinded to form a top surface 3000s of the dielectric encapsulation layer 3000 and the rear surfaces RS of the integrated circuit components 200 is also grinded to form planarized rear surfaces RS. The surface roughness of the planarized rear surfaces RS of the integrated circuit components 200 and the top surface 3000s of the dielectric encapsulation layer 3000 may be less than about 0.5 µm. In some embodiments, the planarized rear surfaces RS of the integrated circuit components 200 are substantially coplanar with the top surface 3000s of the dielectric encapsulation layer 3000. The integrated circuit components 200 may be grinded until the through semiconductor vias 212 are revealed by the planarized rear surfaces RS of the integrated circuit components 200 for further electrical connection.

In some embodiments, after the planarization process, the through semiconductor vias 212 may penetrate through the semiconductor substrate 210 so that the through semiconductor vias 212 allow electrical communication between the front side and the back side of the corresponding integrated circuit components 200. In some other embodiments, after the through semiconductor vias 212 are revealed, the semiconductor substrate 210 of the integrated circuit components 200 may be further grinded to render desired thicknesses of the integrated circuit components 200. In some other embodiments, during thinning the dielectric material layer 3000', the first substrate 1100 of the first semiconductor wafer W1 may be thinned at the same time, thereby reducing the overall thickness of the structure.

Figure 4:
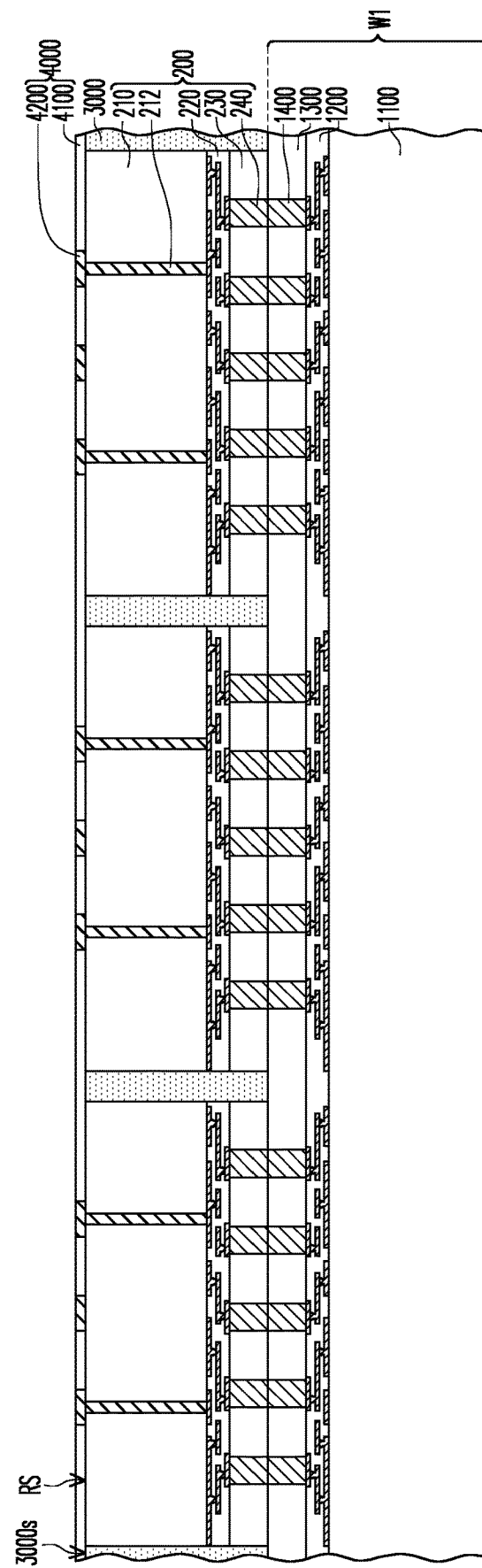

Referring to FIG. 4, a bonding layer 4000 is formed on the integrated circuit components 200 and the dielectric encapsulation layer 3000. In some embodiments, the bonding layer 4000 includes a dielectric layer 4100 and conductive features 4200 laterally wrapped by the dielectric layer 4100. For example, a dielectric material (not shown) may be formed over the planarized rear surfaces RS of the integrated circuit components 200 and the top surface 3000s of the dielectric encapsulation layer 3000 by spin-coating, laminating, or other suitable deposition techniques. Next, the dielectric material is patterned to form the dielectric layer 4100 having a plurality of openings (not shown) using, for example, lithography and etching processes, or other suitable methods. The openings of the dielectric layer 4100 may expose at least a portion of the through semiconductor vias 212 of the integrated circuit components 200 on the planarized rear surface RS. Subsequently, a conductive material may be formed in the openings of the dielectric layer 4100 so as to form the conductive features 4200 using plating, sputtering, or other suitable depositing process. The conductive features 4200 formed on the planarized rear surfaces RS may be electrically and physically connected to the through semiconductor vias 212 of the integrated circuit components 200 for further electrical connection. The conductive features 4200 of the bonding layer 4000 may be formed within the area of the planarized rear surfaces RS. In some alternative embodiments, the conductive features 4200 of the bonding layer 4000 may be formed to expand wider than the area of the planarized rear surfaces RS so as to reroute electrical signals of the integrated circuit components 200.

Figure 5:
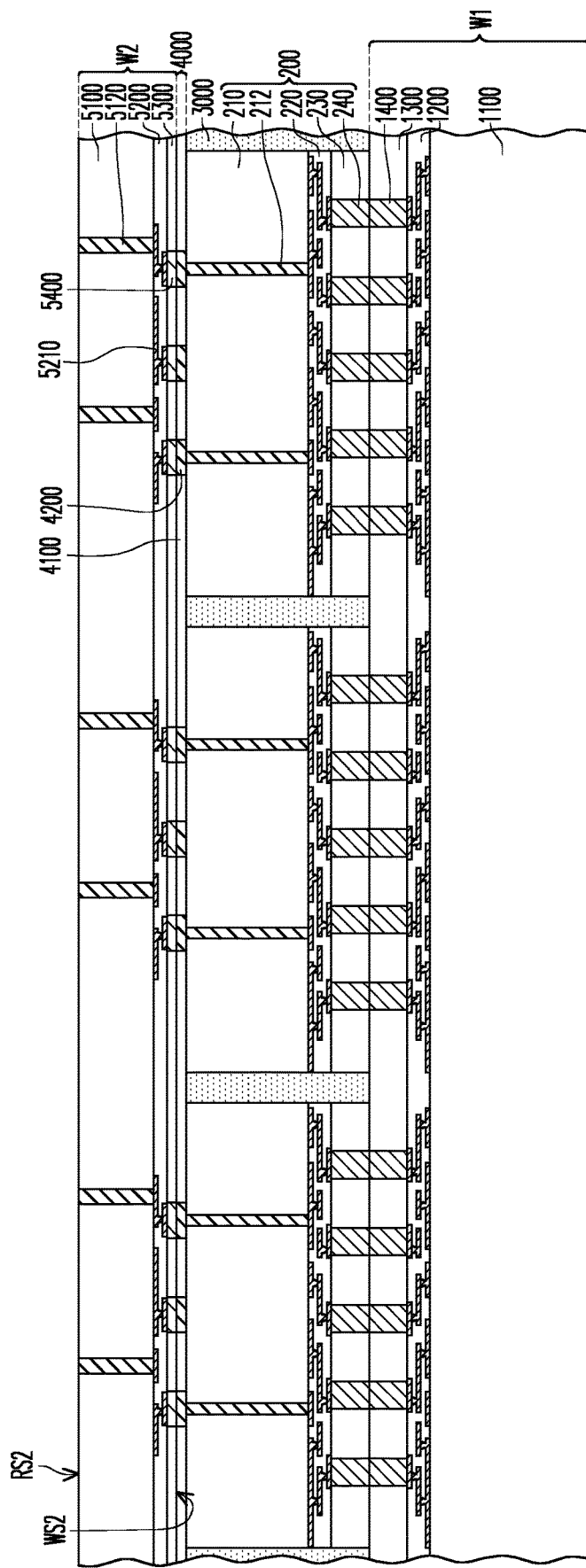

Referring to FIG. 5, a second semiconductor wafer W2 is bonded with the bonding layer 4000. In some embodiments, the second semiconductor wafer W2 includes a second substrate 5100, at least one second through semiconductor via 5120 embedded in the second substrate 5100, a second interconnection layer 5200 formed over the second substrate 5100, a second dielectric layer 5300 formed over the second interconnection layer 5200, and a plurality of second conductive connectors 5400 embedded in the second dielectric layer 5300. The second substrate 5100 may be a silicon wafer, a semiconductor substrate (e.g., a bulk semiconductor which may be doped or undoped), or other suitable substrates (e.g., a multi-layered, gradient substrate, etc.). The semiconductor material of the second substrate 5100 may be similar with that of the first substrate 1100 of the first semiconductor wafer W1. In some embodiments, the second substrate 5100 may include various electrical components (e.g., transistors, capacitors, resistors, inductors, combinations of these, or the like) and metallization patterns interconnected each other to perform one or more functions.

In some embodiments, the second through semiconductor vias 5120 are formed to extend into the second substrate 5100. For example, the second through semiconductor vias 5120 may be formed by forming recesses in the second substrate 5100 by etching, laser drilling, a combination thereof, and/or the like. In some embodiments, a thin dielectric material (not shown) may be formed in the recesses using an oxidation technique or the like. A barrier layer (not shown) may be conformally deposited over the second substrate 5100 and in the recesses by any suitable deposition technique. Subsequently, a conductive material may be deposited over the barrier layer by plating, sputtering, deposition, or the like. Excess of the conductive material and barrier layer may be removed from the second substrate 5100 by, for example, a CMP process or the like. The second through semiconductor vias 5120 collectively include the barrier layer and conductive material, with the barrier layer between the conductive material and the second substrate 5100. It should be noted that the number of second through semiconductor vias 5120 merely serves as an illustrative example, and the disclosure is not limited thereto. In some embodiments, the second through semiconductor vias 5120 penetrate through the second substrate 5100 and a surface of the second substrate 5100 exposes at least a portion of the second through semiconductor vias 5120 for further electrical connection. For example, the top surfaces of the second through semiconductor vias 5120 are substantially coplanar with the surface of the second substrate 5100, and the top surfaces of the second through semiconductor vias 5120 and the surface of the second substrate 5100 may be collectively referred to as a rear surface RS2 of the second semiconductor wafer W2.

In some embodiments, the second interconnection layer 5200 includes a plurality of second conductive patterns 5210 embedded in a second dielectric material 5220. In some embodiments, the second conductive conductors 5400 are laterally wrapped by the second dielectric layer 5300. The second conductive conductors 5400 may include conductive pads electrically coupled to the second through semiconductor vias 5120 through the second interconnection layer 5200. The materials of the second conductive conductors 5400 and the second dielectric layer 5300 may be similar to that of the first conductive conductors 1400 and the first dielectric layer 1300 of the first semiconductor wafer W1. In some embodiments, at least a portion of the second conductive conductors 5400 are revealed by the second dielectric layer 5300. For example, the top surfaces of the second conductive conductors 5400 and the top surface of the second dielectric layer 5300 are substantially level and may be collectively referred to as a second wafer bonding surface WS2.

In some embodiments, the second semiconductor wafer W2 is attached to the bonding layer 4000 by hybrid bonding. For example, a pre-bonding process may be performed, where the second wafer bonding surface WS2 faces toward the bonding layer 4000 and the second conductive conductors 5400 of the second semiconductor wafer W2 and the conductive features 4200 of the bonding layer 4000 are aligned. The second semiconductor wafer W2 and the underlying structure are pressed against together to form weak bonds. After the pre-bonding process, an annealing process may be performed to strengthen the weak bonds and form a fusion bond. During the annealing, the H of the OH bonds is outgassed, thereby forming Si—O—Si bonds between the second semiconductor wafer W2 and the underlying structure, thereby strengthening the bonds. During the hybrid bonding, the direct metal-to-metal bonding may also occur between the second conductive conductors 5400 of the second semiconductor wafer W2 and the conductive features 4200 of the bonding layer 4000. Accordingly, the resulting bond is a hybrid bond including the Si—O—Si bonds and metal-to-metal direct bonds. In some embodiments, the bonding of the structure shown in FIG. 5 may be performed at the wafer-to-die-to-wafer level.

Figure 6:
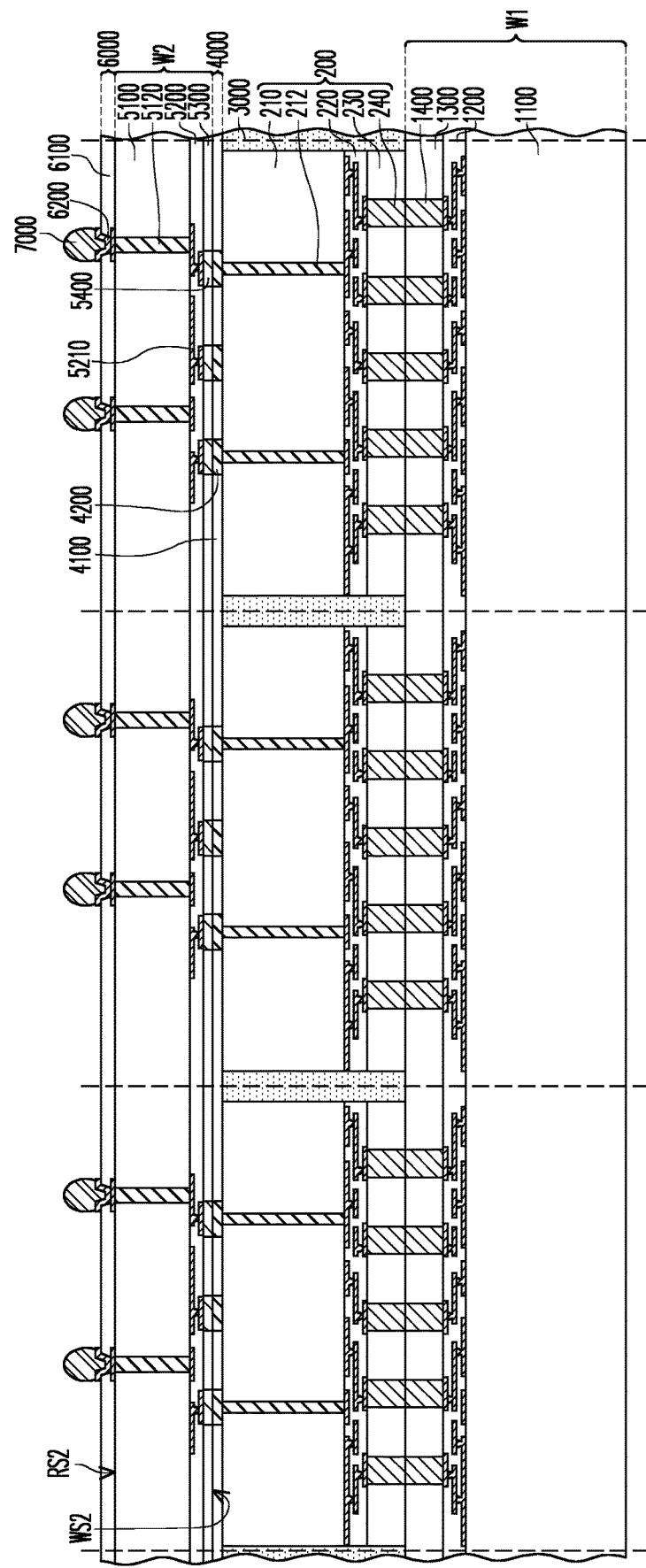

Referring to FIG. 6, a plurality of input/output (I/O) terminals 7000 are disposed on the second semiconductor wafer W2 and electrically connected to the second through semiconductor vias 5120 of the second semiconductor wafer W2. In some embodiments, after bonding the second semiconductor wafer W2 with the bonding layer 4000, a circuitry structure 6000 including one or more dielectric layer(s) 6100 and respective metallization pattern(s) 6200 may be formed over the rear surface RS2 of the second semiconductor wafer W2. The metallization patterns 6200 embedded in the dielectric layer 6100 may be in electrical and physical contact with the second through semiconductor vias 5120 of the second semiconductor wafer W2. In some embodiments, the metallization patterns 6200 include under-ball metallurgy (UBM) features for a subsequent terminal mounting process.

In some embodiments, after forming the circuitry structure 6000, the I/O terminals 7000 are formed on the circuitry structure 6000 to electrically connect the second semiconductor wafer W2 through the metallization patterns 6200 of the circuitry structure 6000. For example, the I/O terminals 7000 are formed on the UBM features of the metallization patterns 6200 through a solder flux. The I/O terminals 7000 may be, for example, metal pillars, solder balls, ball grid array (BGA) balls, controlled collapse chip connection (C4) bumps, micro bumps, electroless nickel-electroless palladium-immersion gold technique (ENEPIG) formed bumps, combinations thereof, or the like. In some embodiments, the I/O terminals 7000 are made of a conductive material with low resistivity, such as Sn, Pb, Ag, Cu, Ni, Bi, or an alloy thereof. In some embodiments, the I/O terminals 7000 are formed by initially forming a layer of solder through such as evaporation, plating, printing, solder transferring, ball placement, or the like. Once a layer of solder has been formed, a reflow may be performed in order to shape the material into the desired terminal shapes. In alternative embodiment, the I/O terminals 7000 are metal pillars (e.g., solder free and have substantially vertical sidewalls) formed by sputtering, printing, plating, or the like. In certain embodiments, a metal cap layer (not shown) is formed on the top of the I/O terminals 7000 by a plating process.

In some embodiments, after forming the I/O terminals 7000, a singulation process may be performed to cut the first semiconductor wafer W1, the second semiconductor wafer W2, and the dielectric encapsulation layer 3000. In some embodiments, the singulation process involves dicing with a rotating blade or a laser beam. The dicing or singulation process includes a laser cutting process, a mechanical cutting process, or other suitable processes. In some embodiments, during the singulation process, the first semiconductor wafer W1, the second semiconductor wafer W2, and the dielectric encapsulation layer 3000 may be cut off along scribe lines so as to be divided into a plurality of semiconductor devices 10A (as shown in FIG. 7).

Figure 7:
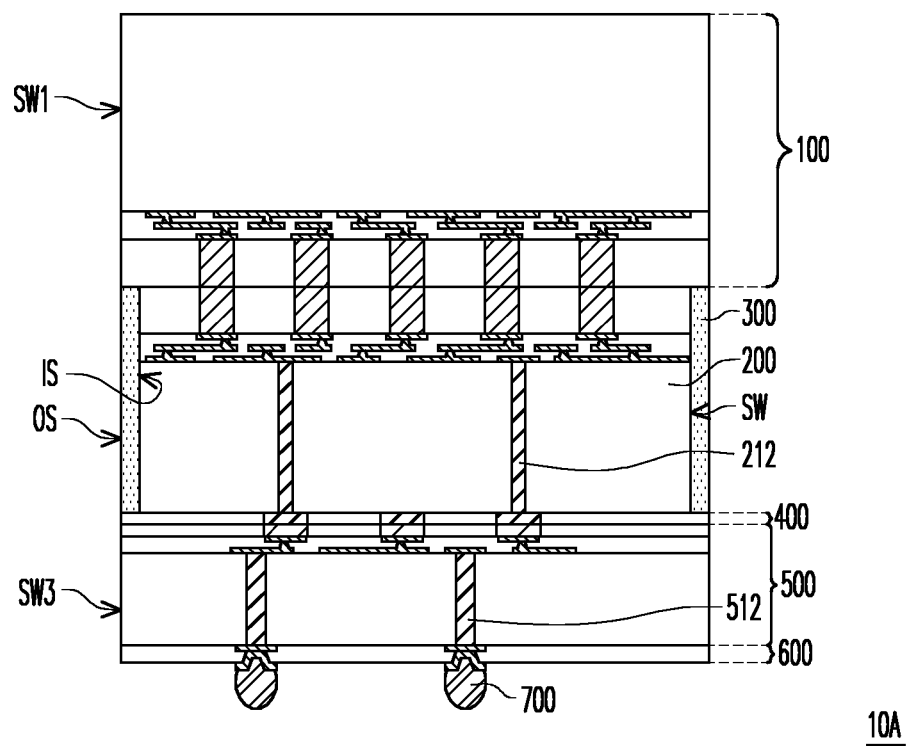

Referring to FIG. 7, the semiconductor device 10A includes a multi-leveled IC component stack having at least one discrete die (e.g., the integrated circuit component 200) packaging therein. In some embodiments, the semiconductor device 10A may be referred to as the system on integrated circuit (SoIC) device. For example, the semiconductor device 10A includes a first integrated circuit component 100 (e.g., singulated from the first semiconductor wafer W1), the integrated circuit component 200 (i.e. second integrated circuit component) stacked on and electrically connected to the first integrated circuit component 100, a dielectric encapsulation 300 (e.g., singulated from the dielectric encapsulation layer 3000) laterally encapsulating the integrated circuit component 200, a bonding layer 400 (e.g., singulated from the bonding layer 4000) disposed between the integrated circuit component 200 and a third integrated circuit component 500, the third integrated circuit component 500 (e.g., singulated from the second semiconductor wafer W2) stacked on and electrically connected to the integrated circuit component 200, a circuit layer 600 (e.g., singulated from the circuitry structure 6000) stacked on the integrated circuit component 200 and electrically connected to the through semiconductor vias 212 of the integrated circuit component 200, and a plurality of I/O terminals 700 disposed on the third integrated circuit component 500 and electrically connected to the second through semiconductor vias 512 of the third integrated circuit component 500.

In some embodiments, the integrated circuit component 200 and the third integrated circuit component 500 are electrically connected to each other through the bonding layer 400. The dielectric encapsulation 300 may be disposed on the first integrated circuit component 100 and may laterally encapsulate the integrated circuit component 200, and the third integrated circuit component 500 may be disposed on the integrated circuit component 200 and the dielectric encapsulation 300. For example, inner sidewalls IS of the dielectric encapsulation 300 are in contact with the sidewalls SW of the integrated circuit component 200 such that the sidewalls SW of the integrated circuit component 200 are well protected. In some embodiments, outer sidewalls OS of the dielectric encapsulation 300 are substantially aligned with sidewalls SW1 of the first integrated circuit component 100 and sidewalls SW3 of the third integrated circuit component 500. The integrated circuit component 200 may include the through semiconductor vias 212 and the third integrated circuit component 500 may include second through semiconductor vias 512 electrically connected to the through semiconductor vias 212 of the integrated circuit component 200.

Figure 8:
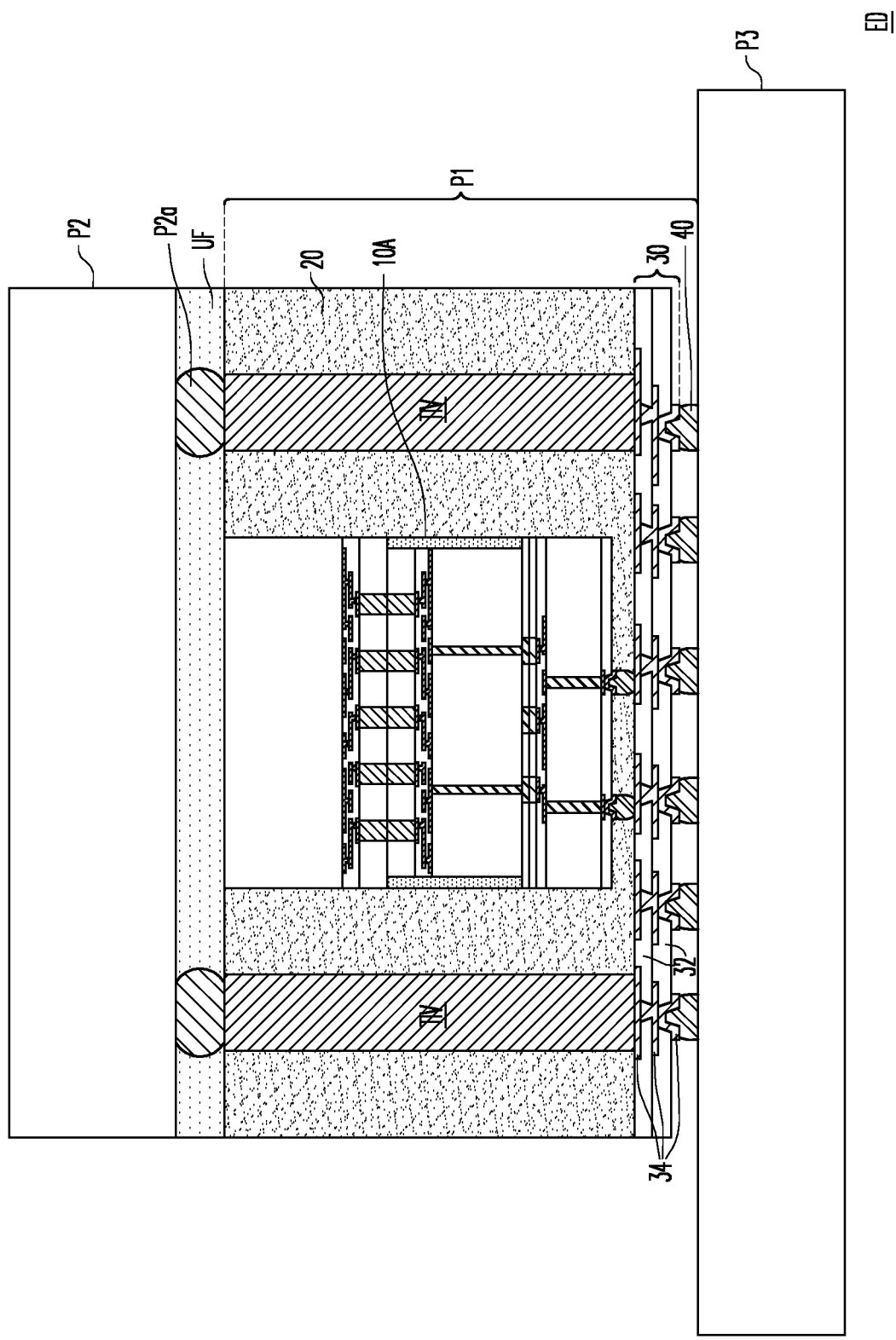
FIG. 8 is a schematic cross-sectional view showing an application of a semiconductor device according to some exemplary embodiments of the present disclosure.

FIG. 8 is a schematic cross-sectional view showing an application of a semiconductor device according to some exemplary embodiments of the present disclosure. Referring to FIG. 8, an electronic device ED including the semiconductor device 10A packaged therein is provided. For example, the electronic device ED includes at least a first package structure P1. In some embodiments, the first package structure P1 includes the semiconductor device 10A wrapped by an insulting encapsulation 20, a redistribution structure 30 formed over the semiconductor device 10A and the insulating encapsulation 20, and a plurality of conductive terminals 40 formed over the redistribution structure 30 for further electrical connection. The insulting encapsulation 20 may be a molding compound, epoxy resins, or the like, and may be formed by compression molding, transfer molding, or the like. The redistribution structure 30 may be formed of alternating layers of dielectric material 32 and conductive material 34 with vias interconnecting the layers of conductive material 34 and may be formed through suitable deposition, patterning and metallization techniques. The conductive terminals 40 connected to the conductive material 34 of the redistribution structure 30 may be ball grid array (BGA) terminals, solder balls, or the like. In some embodiments, the first package structure P1 further includes at least one through insulating via TIV embedded in the insulating encapsulation 20 and aside the semiconductor device 10A for further electrical stacking. In some embodiments, the first package structure P1 is referred to as an integrated fan-out (InFO) package structure.

In some embodiments, the electronic device ED further includes a second package structure P2 stacked on the first package structure P1 so as to form a package-on-package (PoP) structure. In some embodiments, a plurality of external terminals P2a of the second package structure P2 are in electrical and physical contact with the through insulating vias TIV of the first package structure P1. The second package structure P2 may be electrically coupled to the semiconductor device 10A through the through insulating vias TIV and the redistribution structure 30. In some embodiments, the second package structure P2 includes at least one semiconductor die (not shown) having the processing, memory, electronic control, and/or other functionalities. In some embodiments, an underfill UF is formed between the first package structure P1 and the second package structure P2 to encapsulate the external terminals P2a. For example, the underfill UF may be made of a liquid epoxy that is dispensed between the first package structure P1 and the second package structure P2, and then cured to harden. In alternative embodiments, no underfill is used.

In some embodiments, the electronic device ED further includes a package component P3 connected to the conductive terminals 40 of the first package structure P1. The semiconductor device 10A of the first package structure P1 may be electrically coupled to the second package structure P2 and the package component P3. For example, the package component P3 is a printed circuit board (PCB), such as a single-layer PCB or a multiple-layer PCB. In some embodiments, metallic interconnects (not shown) may be formed in/on the package component P3, and are electrically coupled to the conductive terminals 40 of the first package structure P1. In some other embodiments, the package component P3 includes a device package, an interposer, or any other types of package component. It should be appreciated that the above examples are provided for illustrative purposes, and other embodiments may utilize fewer or additional elements. In addition, other package structure/component may be used as appropriate for a given application.

Figure 9:
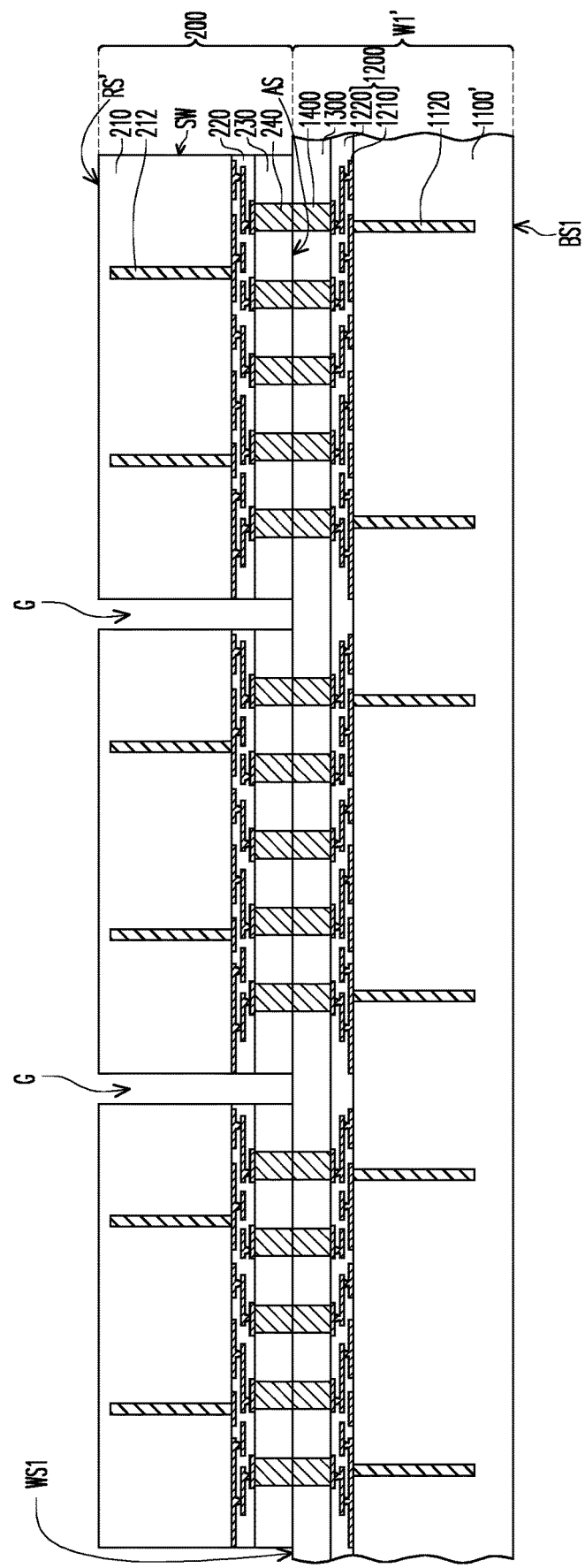
FIGS. 9 through 13 are schematic cross-sectional views showing various stages in a manufacturing method of a semiconductor device according to some exemplary embodiments of the present disclosure.

FIGS. 9 through 12 are schematic cross-sectional views showing various stages in a manufacturing method of a semiconductor device according to some exemplary embodiments of the present disclosure. The identical or similar numbers will be denoted by the identical or similar elements throughout the drawings, and detail thereof is not repeated. Referring to FIG. 9, the integrated circuit components 200 are bonded with a first semiconductor wafer W1'. The first semiconductor wafer W1' may be similar to the first semiconductor wafer W1 shown in FIG. 1 and the differences lie in that the first semiconductor wafer W1' includes a plurality of first through semiconductor vias 1120 embedded in the first substrate 1100'.

For example, the first substrate 1100' is provided with a plurality of openings (not shown) and a conductive material is formed therein, thereby forming the first through semiconductor vias 1120 in the first substrate 1100'. The openings of the first substrate 1100' may or may not penetrate through the first substrate 1100'. In some embodiments, a liner (e.g., a diffusion barrier layer, an adhesion layer, or the like; not shown) may be formed inside the openings of the first substrate 1100' by a deposition process or other suitable techniques. Next, a seed layer (not shown), which may include copper or a copper alloy, may be deposited inside the openings of the first substrate 1100', and then the conductive material may be formed inside the openings using, for example, plating or other suitable techniques. The conductive material may be a metallic material including a metal or a metal alloy such as copper, silver, gold, tungsten, cobalt, aluminum, or alloys thereof. A planarization process is optionally performed to remove excess conductive material such that top surfaces of the first through semiconductor vias 1120 and the first substrate 1100' are substantially coplanar. The first interconnection layer 1200 is then formed over the first substrate 1100' and the first through semiconductor vias 1120 such that the first interconnection layer 1200 is electrically connected to the first through semiconductor vias 1120. Subsequently, the first dielectric layer 1300 and the first conductive connectors 1400 are formed over the first interconnection layer 1200 and the first conductive connectors 1400 are electrically connected to the first through semiconductor vias 1120 through the first interconnection layer 1200. The first semiconductor wafer W1' may include the first wafer bonding surface WS1 and a back surface BS1 opposite to the first wafer bonding surface WS1. In some embodiments, the first through semiconductor vias 1120 do not penetrate through the first substrate 1100' at this stage, so that the first through semiconductor vias 1120 are not exposed by the back surface BS1. One end of each first through semiconductor via 1120 is in physical and electrical contact with the first interconnection layer 1200 and the opposite end of each first through semiconductor via 1120 is buried inside the first substrate 1100'.

In some embodiments, the integrated circuit components 200 are bonded to the first wafer bonding surface WS1 of the first semiconductor wafer W1' using, for example, hybrid bonding, or other applicable techniques. After bonding, the integrated circuit components 200 distributed on the first wafer bonding surface WS1 may be separated from one another, such that the gaps G are formed between two adjacent integrated circuit components 200. In some embodiments, the first conductive connectors 1400 of the first semiconductor wafer W1' are substantially aligned and in direct contact with the die conductors 240 of the integrated circuit components 200.

Figure 10:
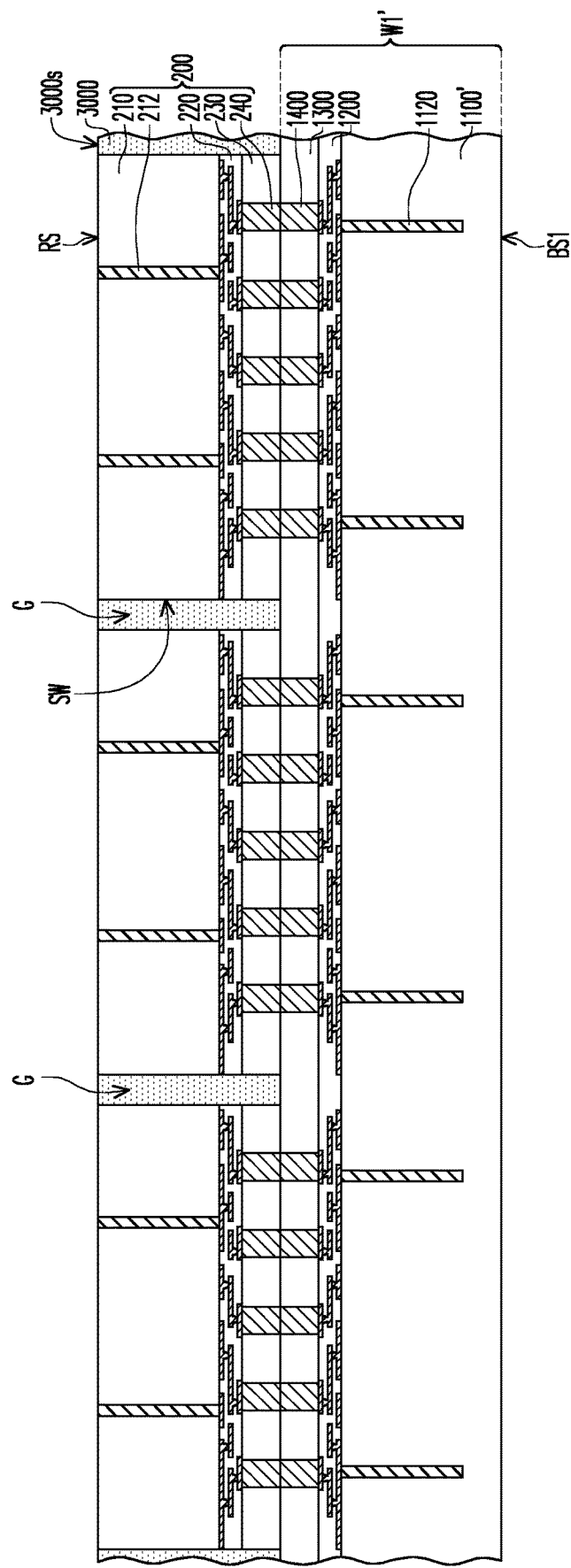

Referring to FIG. 10, after bonding the integrated circuit components 200 with the first semiconductor wafer W1, the dielectric encapsulation layer 3000 is formed over the first semiconductor wafer W1' to laterally encapsulate the integrated circuit components 200. The dielectric encapsulation layer 3000 in FIG. 10 may be similar to the dielectric encapsulation layer 3000 described in FIG. 3, so the detailed descriptions are omitted herein. In some embodiments, the dielectric encapsulation layer 3000 fills the gaps G between two adjacent integrated circuit components 200 and covers the sidewalls SW of each integrated circuit component 200 for protection. In some embodiments, at least a portion of the through semiconductor vias 212 of the integrated circuit components 200 may be exposed by the planarized rear surfaces RS for further electrical connection. The planarized rear surfaces RS of the integrated circuit components 200 and the top surface 3000s of the dielectric encapsulation layer 3000 may be substantially coplanar. In some alternative embodiments, when the dielectric material layer 3000' is partially removed to reveal the integrated circuit components 200 so as to form the dielectric encapsulation layer 3000, the first substrate 1100' of the first semiconductor wafer W1' may also be thinned until the first through semiconductor vias 1120 are revealed by the back surface BS1 of the first semiconductor wafer W1' for further electrical connection.

Figure 11:
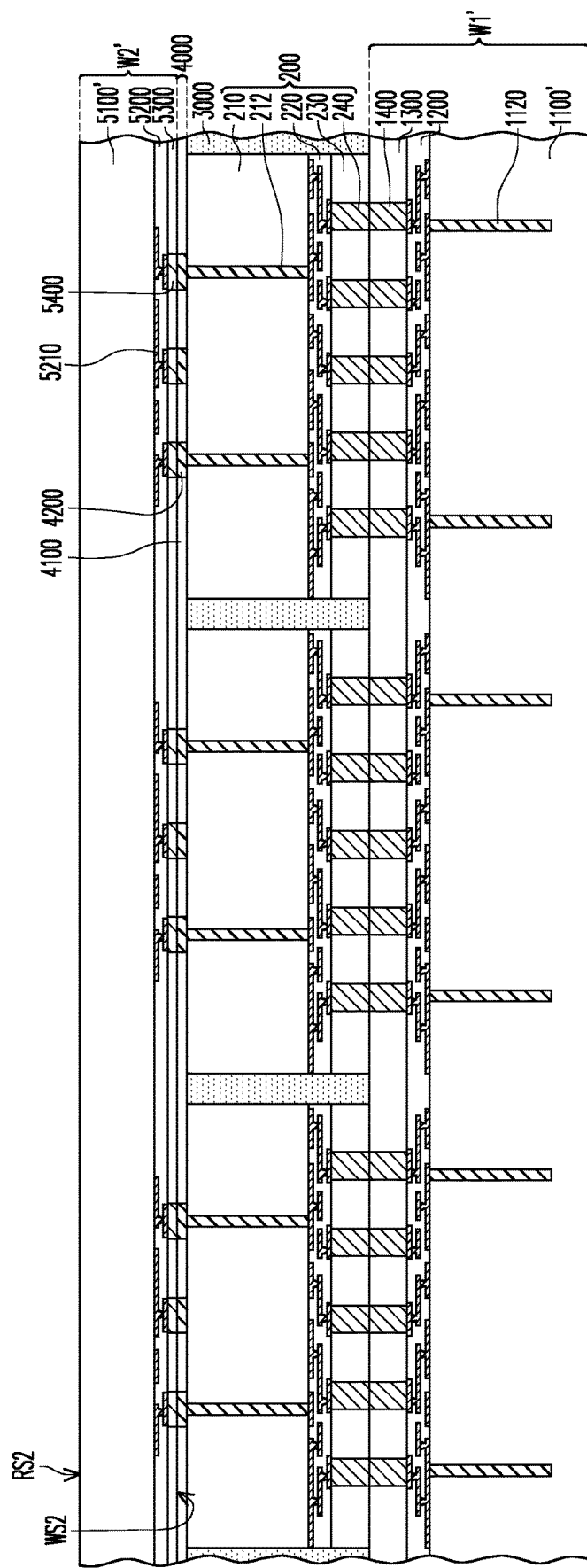

Referring to FIG. 11, a bonding layer 4000 is formed over the integrated circuit components 200 and the dielectric encapsulation layer 3000 and a second semiconductor wafer W2' is bonded with the bonding layer 4000. The bonding layer 4000 including the dielectric layer 4100 and the conductive features 4200 may be similar to the bonding layer 4000 shown in FIG. 4, and the detailed descriptions are omitted for brevity. After forming the bonding layer 4000, the second semiconductor wafer W2' is attached to the bonding layer 4000 through hybrid bonding. The second semiconductor wafer W2' in FIG. 11 may be similar to the second semiconductor wafer W2 described in FIG. 5 and the difference therebetween lies in that the second semiconductor wafer W2' is free of the through semiconductor vias in the second substrate 5100'.

Figure 12:
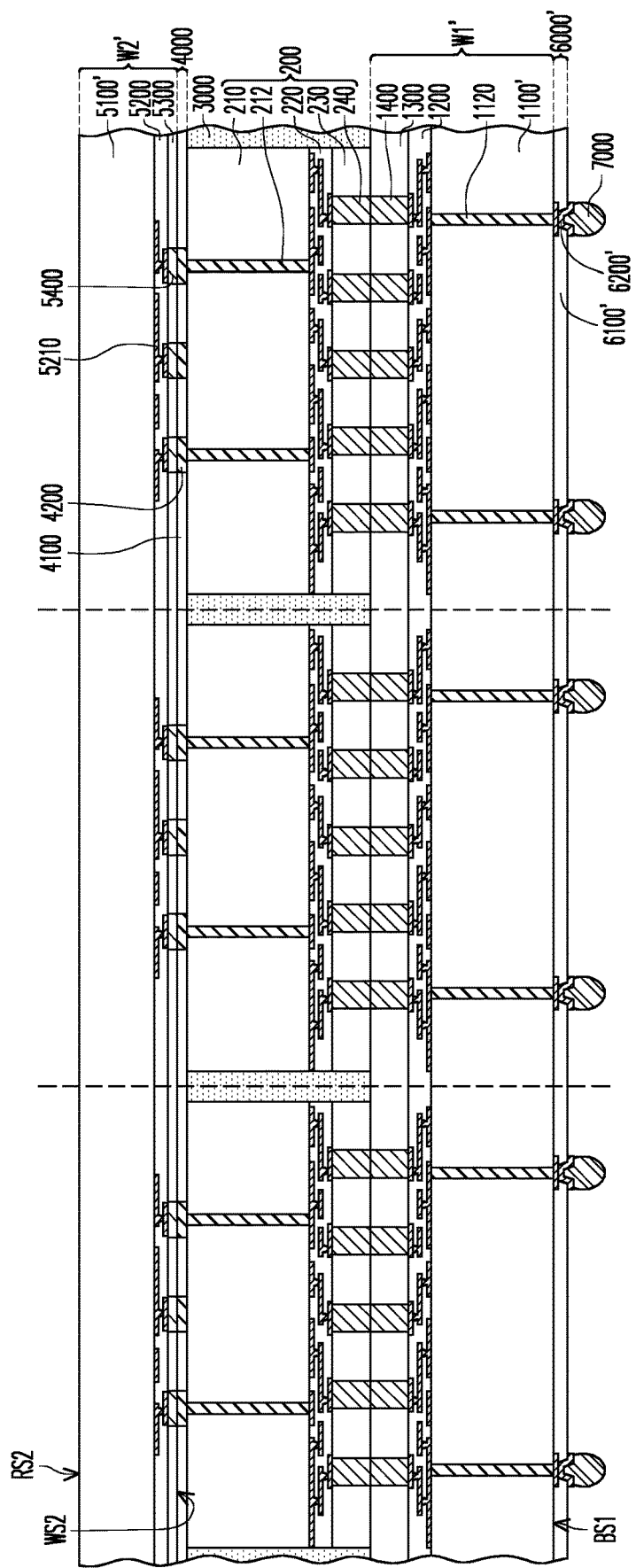

Referring to FIG. 12, the first through semiconductor vias 1120 of the first semiconductor wafer W1' is exposed by the back surface BS1 and a plurality of I/O terminals 7000 are disposed on the first semiconductor wafer W1' and electrically coupled to the first through semiconductor vias 1120. After bonding the second semiconductor wafer W2, the structure is optionally overturned (e.g., flipped upside down) for further processing onto the back surface BS1 of the first semiconductor wafer W1'. The first substrate 1100' may be thinned until the first through semiconductor vias 1120 are revealed by the back surface BS1 of the first semiconductor wafer W1' using a mechanical grinding process and/or a CMP process, or other suitable processes. In some embodiments, after exposing the first through semiconductor vias 1120, a circuitry structure 6000' including the dielectric layer 6100' and the metallization patterns 6200' may be formed over the back surface BS1 of the first semiconductor wafer W1'. The metallization patterns 6200' embedded in the dielectric layer 6100' may be in electrical and physical contact with the first through semiconductor vias 1120 of the first semiconductor wafer W1'. The metallization patterns 6200' may include UBM features for mounting I/O terminals 7000. After formation, a singulation process is performed on the structure along the scribe lines to obtain a plurality of semiconductor devices 10B (shown in FIG. 12).

Figure 13:
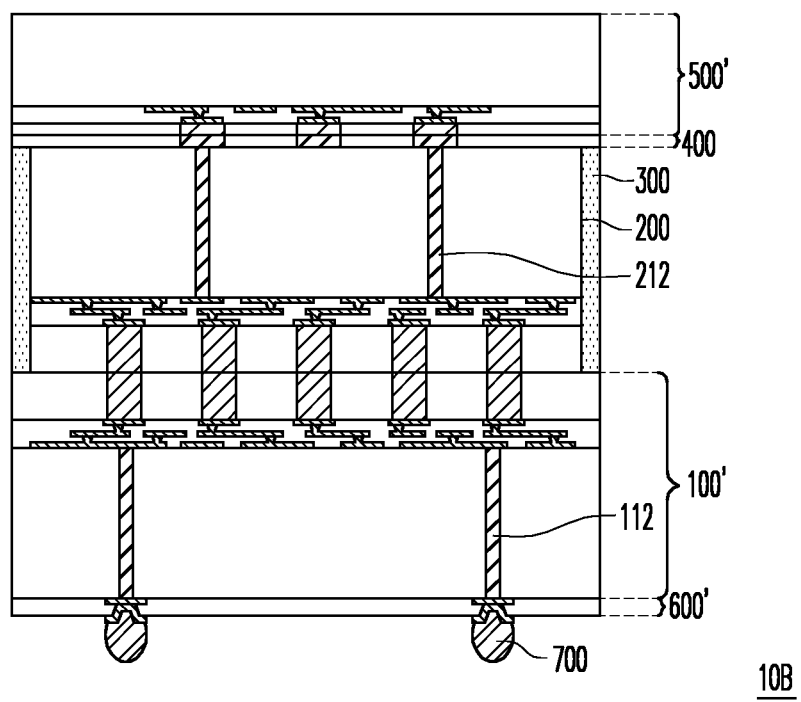

Referring to FIG. 13, the semiconductor device 10B includes a first integrated circuit component 100' (e.g., singulated from the first semiconductor wafer W1'), the integrated circuit component 200 (i.e. second integrated circuit component) stacked on and electrically connected to the first integrated circuit component 100', a dielectric encapsulation 300 (e.g., singulated from the dielectric encapsulation layer 3000) laterally encapsulating the integrated circuit component 200, a bonding layer 400 (e.g., singulated from the bonding layer 4000) disposed between the integrated circuit component 200 and a third integrated circuit component 500', the third integrated circuit component 500' (e.g., singulated from the second semiconductor wafer W2') stacked on and electrically connected to the integrated circuit component 200, a circuit layer 600' (e.g., singulated from the circuitry structure 6000') stacked on the first integrated circuit component 100' and electrically connected to the first through semiconductor vias 112 of the first integrated circuit component 100', and a plurality of I/O terminals 700 disposed on the circuit layer 600' and electrically connected to the first through semiconductor vias 112 of the first integrated circuit component 100' through the circuit layer 600'. In some embodiments, the first through semiconductor vias 112 of the first integrated circuit component 100' and the through semiconductor vias 212 of the integrated circuit component 200 are electrically connected. The semiconductor device 10B may perform a variety of electrical functions necessary for different applications. It should be appreciated that the semiconductor device 10B can further be packaged to form a package-on-package (PoP) structure or system-in-package (SiP) structure using suitable packaging techniques. The applications of the semiconductor device 10B are not limited in the disclosure.

Figure 14:
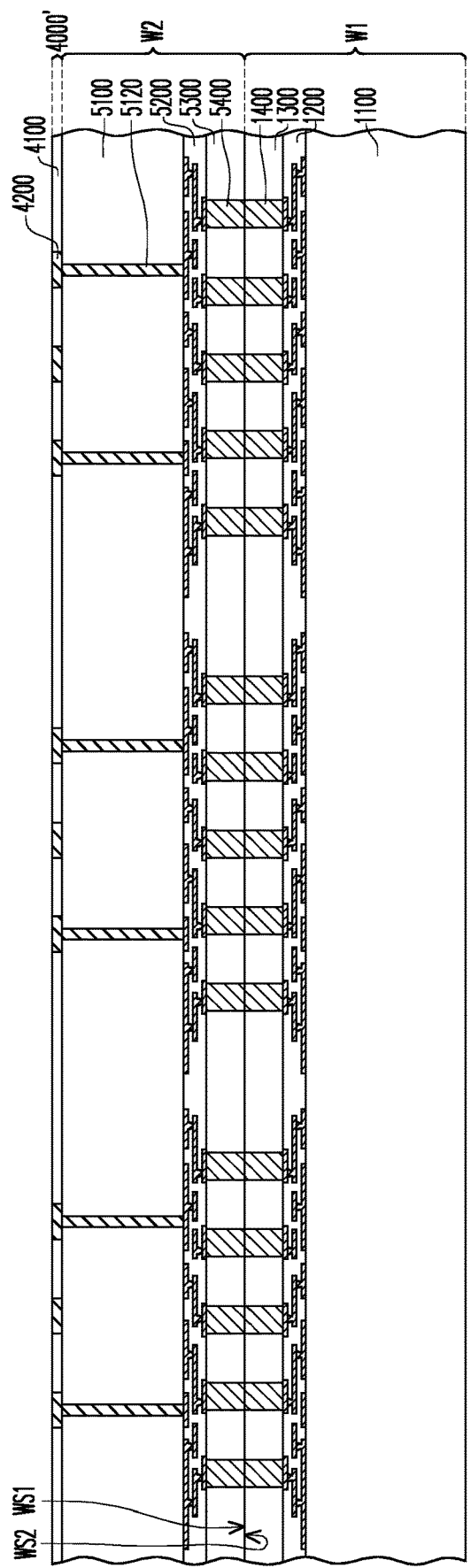
FIGS. 14 through 18 are schematic cross-sectional views showing various stages in a manufacturing method of a semiconductor device according to some exemplary embodiments of the present disclosure.

FIGS. 14 through 18 are schematic cross-sectional views showing various stages in a manufacturing method of a semiconductor device according to some exemplary embodiments of the present disclosure. Referring to FIG. 14, the bonding may be at wafer-to-wafer level, for example, the first semiconductor wafer W1 is bonded with the second semiconductor wafer W2. In some embodiments, the first wafer bonding surface WS1 of the first semiconductor wafer W1 is immediately in contact with the second wafer bonding surface WS2 of the second semiconductor wafer W2. For example, the bonding of the second semiconductor wafer W2 to the first semiconductor wafer W1 is achieved by aligning the second conductive connectors 5400 with the first conductive conductors 1400. In some embodiments, pressure is applied to the first semiconductor wafer W1 and the second semiconductor wafer W2 to form a bond therebetween. For example, after the first dielectric layer 1300 and the second dielectric layer 5300 are bonded with a dielectric-to-dielectric bond, the first conductive connectors 1400 and the second conductive conductors 5400 are bonded with a metal-to-metal bond. In some embodiments, the heat may be applied using a thermal anneal process or other heating techniques to strengthen the bonding. In some embodiments, the first semiconductor wafer W1 may be free of through semiconductor vias in the first substrate 1100, while the second semiconductor wafer W2 may include a plurality of second through semiconductor vias 5120 penetrating through the second substrate 5100.

Subsequently, a bonding layer 4000' may be formed on the second semiconductor wafer W2 opposite to the first semiconductor wafer W1. For example, a dielectric material (not shown) may be formed over the second semiconductor wafer W2, and the dielectric material is patterned to form the dielectric layer 4100 having a plurality of openings (not illustrated) using lithography and etching or other suitable process. The openings of the dielectric layer 4100 may expose at least a portion of the second through semiconductor vias 5120. Next, the conductive features 4200 may be deposited in the openings of the dielectric layer 4100 to form the bonding layer 4000' over the second semiconductor wafer W2 for further electrical stacking.

Figure 15:
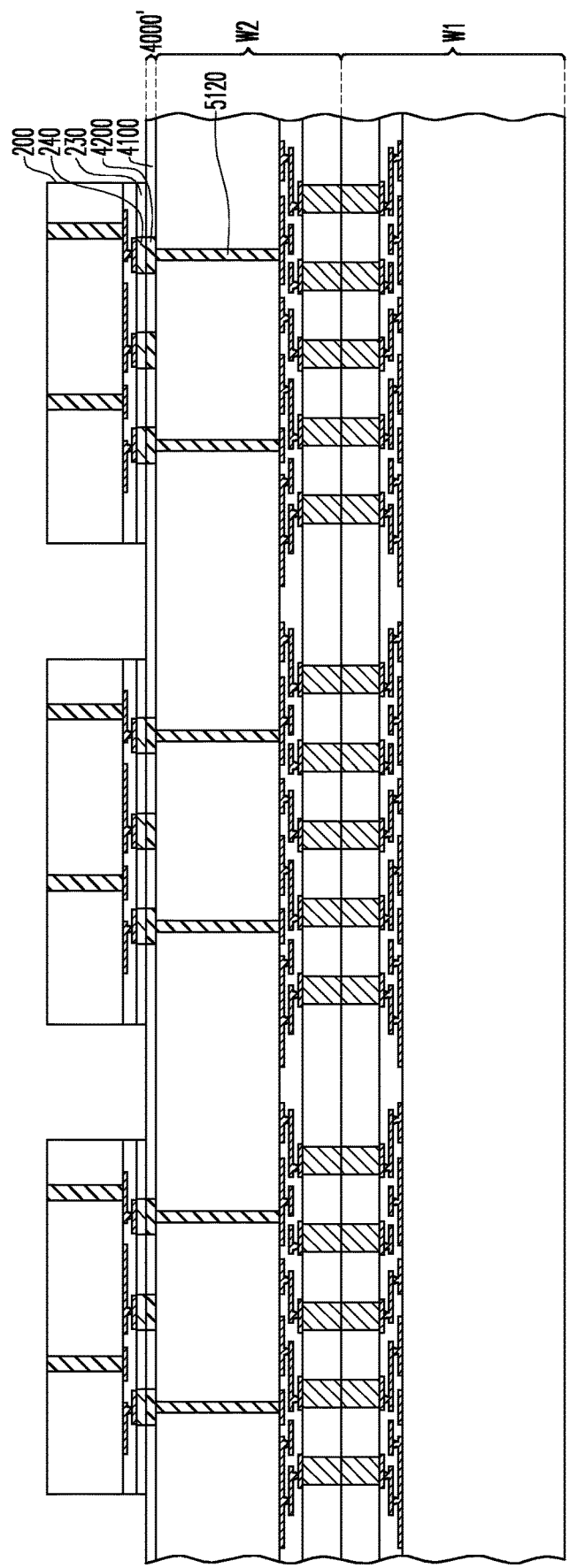

Referring to FIG. 15, the integrated circuit components 200 are bonded with the second semiconductor wafer W2 through the bonding layer 4000'. In some embodiments, the integrated circuit components 200 are picked and placed on the bonding layer 4000', and the die conductors 240 of the integrated circuit components 200 may be aligned with the conductive features 4200 of the bonding layer 4000'. After the alignment process, the integrated circuit components 200 and the bonding layer 4000' may be hybrid bonded together by, for example, applying pressure and heat or other suitable methods. Afterwards, the dielectric layers 230 of the integrated circuit components 200 and the dielectric layer 4100 of the bonding layer 4000' are bonded with a dielectric-to-dielectric bond, while the die conductors 240 of the integrated circuit components 200 and the conductive features 4200 of the bonding layer 4000' are bonded with a metal-to-metal bond. The die conductors 240 of the integrated circuit components 200 are electrically connected to the second through semiconductor vias 5120 of the second semiconductor wafer W2 through the conductive features 4200 of the bonding layer 4000'.

Figure 16:
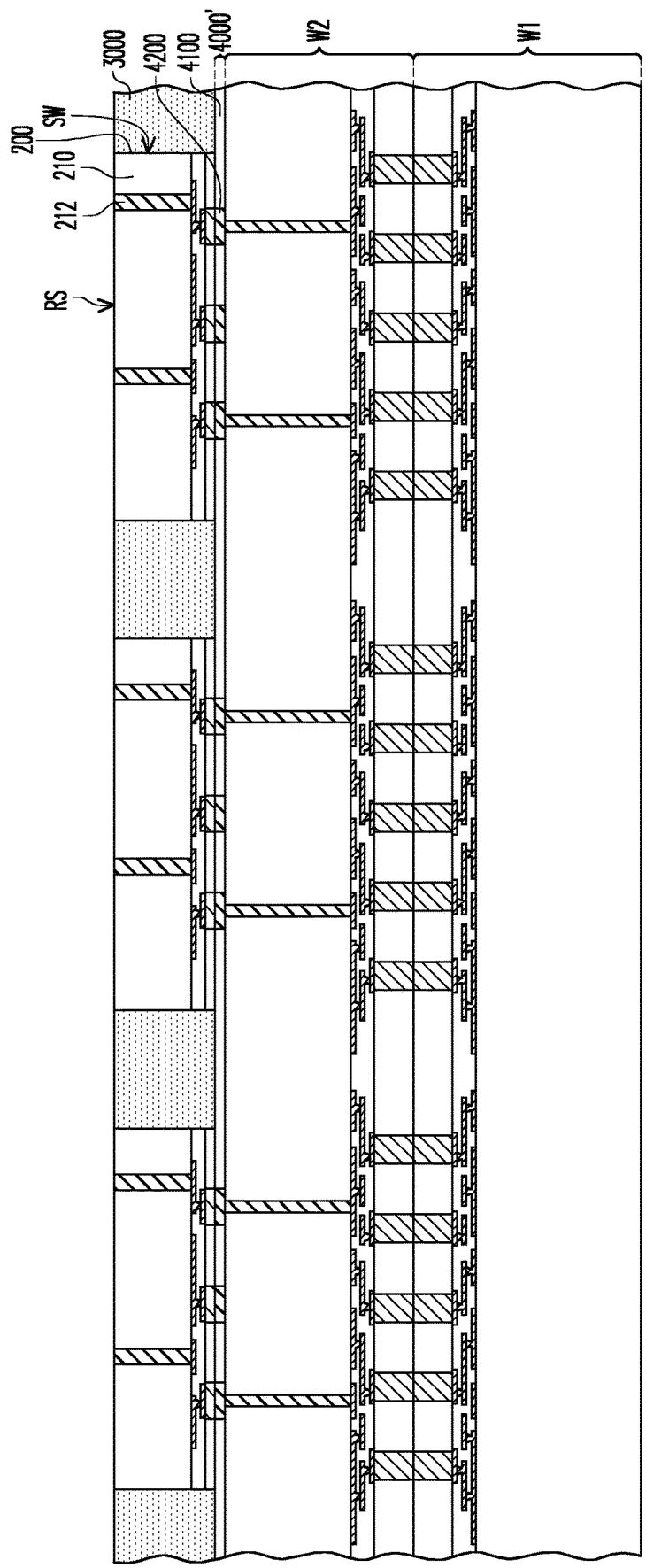

Referring to FIG. 16, a dielectric encapsulation layer 3000 is formed over the second semiconductor wafer W2 to laterally encapsulate the integrated circuit components 200. In some embodiments, after bonding the integrated circuit components 200 and the second semiconductor wafer W2 through the bonding layer 4000', the dielectric encapsulation layer 3000 is formed on the bonding layer 4000' to encapsulate the integrated circuit components 200 such that the dielectric encapsulation layer 3000 covers the sidewalls SW of each integrated circuit component 200 and also in contact with the dielectric layer 4100. In some embodiments, the through semiconductor vias 212 of the integrated circuit components 200 are not revealed from the semiconductor substrate 210 during the bonding process, and after forming the dielectric encapsulation layer 3000, the through semiconductor vias 212 of the integrated circuit components 200 are exposed by the planarized rear surfaces RS and the dielectric encapsulation layer 3000. The formation of the dielectric encapsulation layer 3000 may be similar to that of the dielectric encapsulation layer 3000 shown in FIG. 3, and the detailed descriptions are omitted for brevity. In some embodiments, the bonding of the structure shown in FIG. 16 may be performed at the wafer-to-wafer-to-die level.

Figure 17:
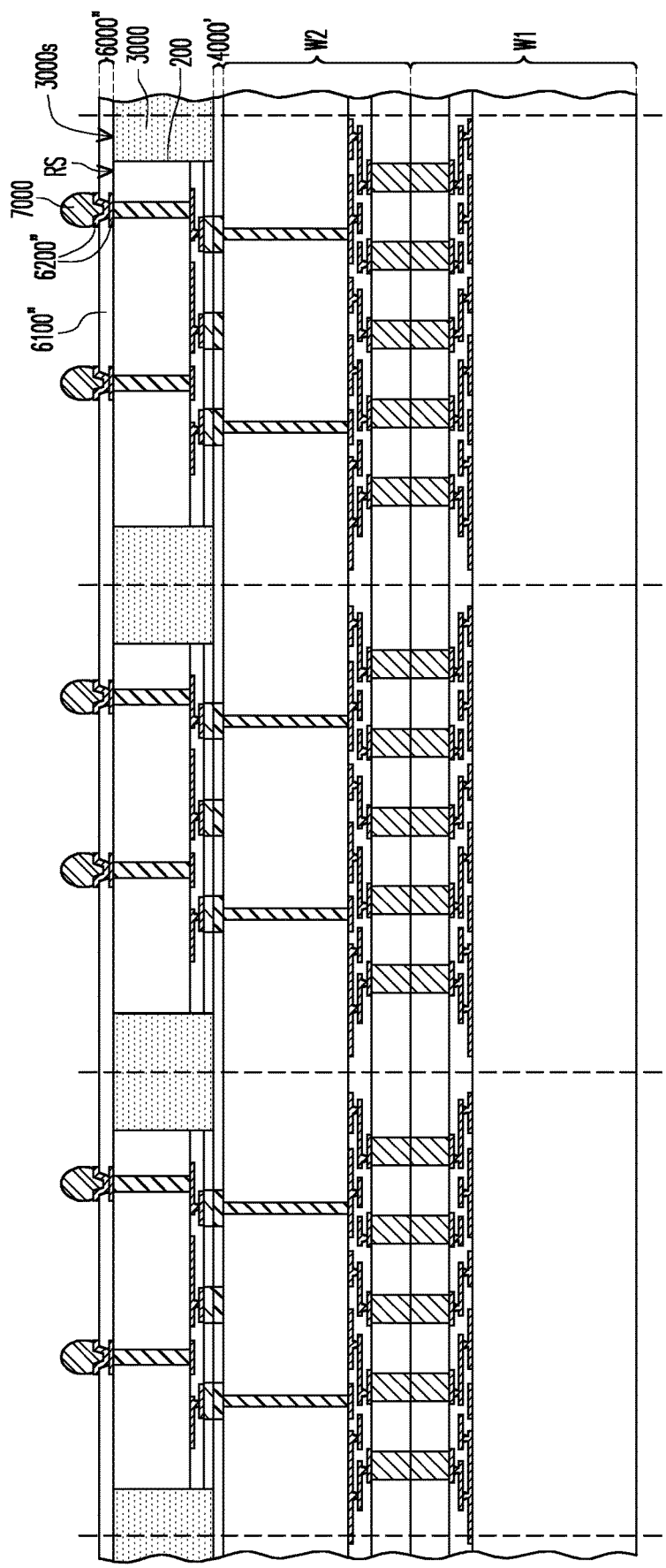

Referring to FIG. 17, the I/O terminals 7000 are formed on the integrated circuit components 200 and electrically connected to the through semiconductor vias 212 of the integrated circuit components 200. In some embodiments, a circuit structure 6000" including the dielectric layer 6100" and the metallization patterns 6200" may be formed over the planarized rear surfaces RS of the integrated circuit components 200 and the top surface 3000s of the dielectric encapsulation layer 3000. The metallization patterns 6200" may be in electrical and physical contact with the through semiconductor vias 212 of the integrated circuit components 200. After forming the circuit structure 6000", the I/O terminals 7000 may be formed on the metallization patterns 6200" of the circuit structure 6000" so that the I/O terminals 7000 are electrically coupled to the underlying integrated circuit components 200, the second semiconductor wafer W2, and the first semiconductor wafer W1. The formation of the circuit structure 6000" and the I/O terminals 7000 may be respectively similar to that of the circuit structure 6000 and the I/O terminals 7000 described in FIG. 6, and the detailed descriptions are omitted for brevity. Afterwards, a singulation process may be performed to cut the first semiconductor wafer W1, the second semiconductor wafer W2, and the dielectric encapsulation layer 3000 along the scribe lines to form a plurality of semiconductor devices 10C (shown in FIG. 18).

Figure 18:
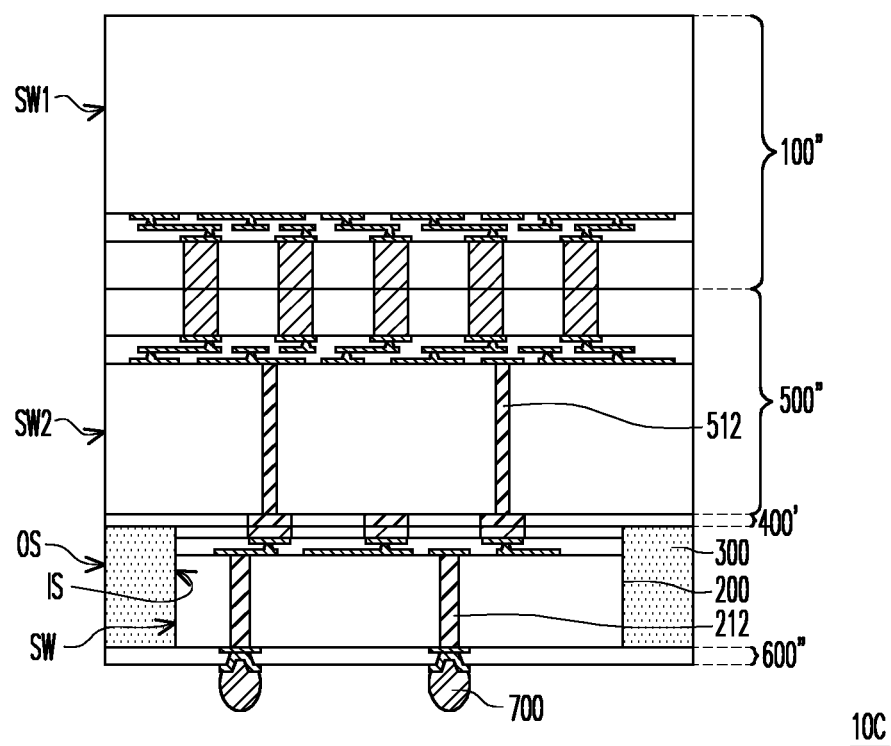

Referring to FIG. 18, the semiconductor device 10C includes a first integrated circuit component 100" (e.g., singulated from the first semiconductor wafer W1), a second integrated circuit component 500" (e.g., singulated from the second semiconductor wafer W2) stacked on and electrically connected to the first integrated circuit component 100", the integrated circuit component 200 (i.e. third integrated circuit component) stacked on and electrically connected to the second integrated circuit component 500", a dielectric encapsulation 300 (e.g., singulated from the dielectric encapsulation layer 3000) laterally encapsulating the integrated circuit component 200, a bonding layer 400' (e.g., singulated from the bonding layer 4000') disposed between the integrated circuit component 200 and the second integrated circuit component 500", a circuit layer 600" (e.g., singulated from the circuitry structure 6000") stacked on the integrated circuit component 200 and the dielectric encapsulation 300 and electrically connected to the through semiconductor vias 212 of the integrated circuit component 200, and a plurality of I/O terminals 700 disposed on the integrated circuit component 200 and electrically connected to the through semiconductor vias 212 of the integrated circuit component 200 through the circuit layer 600".

In some embodiments, the second integrated circuit component 500" is covered by the integrated circuit component 200 and the dielectric encapsulation 300. In some embodiments, the inner sidewalls IS of the dielectric encapsulation 300 are in contact with the sidewalls SW of the integrated circuit component 200, and the outer sidewalls OS of the dielectric encapsulation 300 are substantially aligned with the sidewalls SW1 of the first integrated circuit component and the sidewalls SW2 of the second integrated circuit component 500". In some embodiments, the second integrated circuit component 500" includes a plurality of second through semiconductor vias 512 and the integrated circuit component 200 includes a plurality of through semiconductor vias 212 electrically connected to the second through semiconductor vias 512. It should be appreciated that the semiconductor device 10C can further be packaged to form a package-on-package (PoP) structure, system-in-package (SiP) structure, or form other types of electronic applications using suitable packaging techniques.

Figure 19:
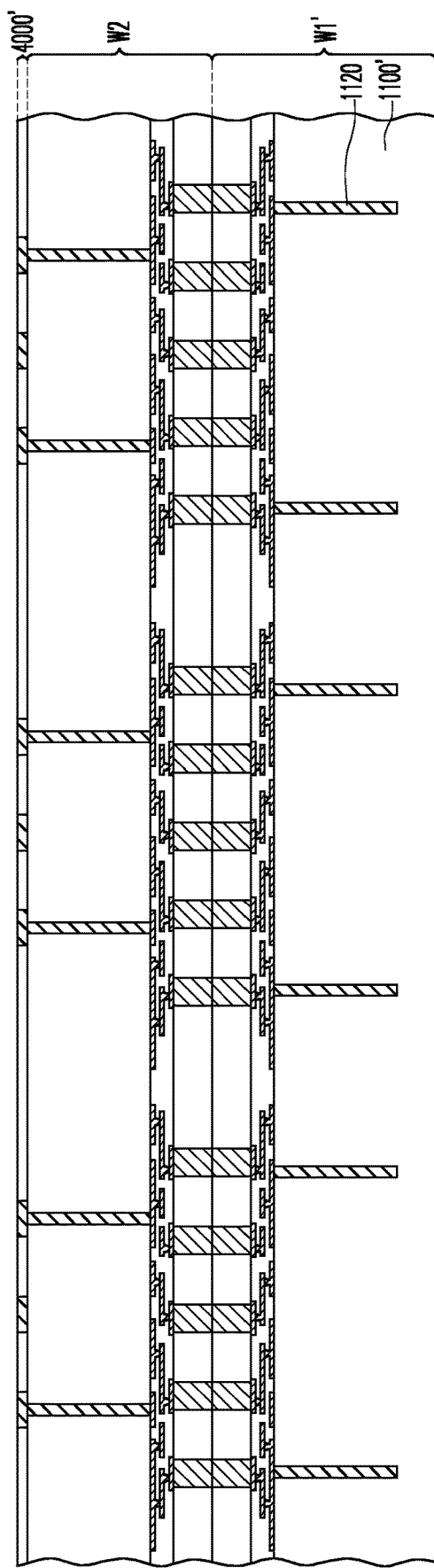
FIGS. 19 through 22 are schematic cross-sectional views showing various stages in a manufacturing method of a semiconductor device according to some exemplary embodiments of the present disclosure.

FIGS. 19 through 22 are schematic cross-sectional views showing various stages in a manufacturing method of a semiconductor device according to some exemplary embodiments of the present disclosure. Referring to FIG. 19, the bonding may be at wafer level, for example, the first semiconductor wafer W1' is bonded with the second semiconductor wafer W2. The bonding layer 4000' may be formed on the second semiconductor wafer W2 opposite to the first semiconductor wafer W1'. The structure shown in FIG. 19 may be similar to the structure illustrated in FIG. 14, and the difference therebetween lies in that the first semiconductor wafer W1' includes a plurality of the first through semiconductor vias 1120 embedded in the first substrate 1100'. The first semiconductor wafer W1' in FIG. 19 may be similar to the first semiconductor wafer W1' described in FIG. 9, so the detailed descriptions are omitted for brevity.

Figure 20:
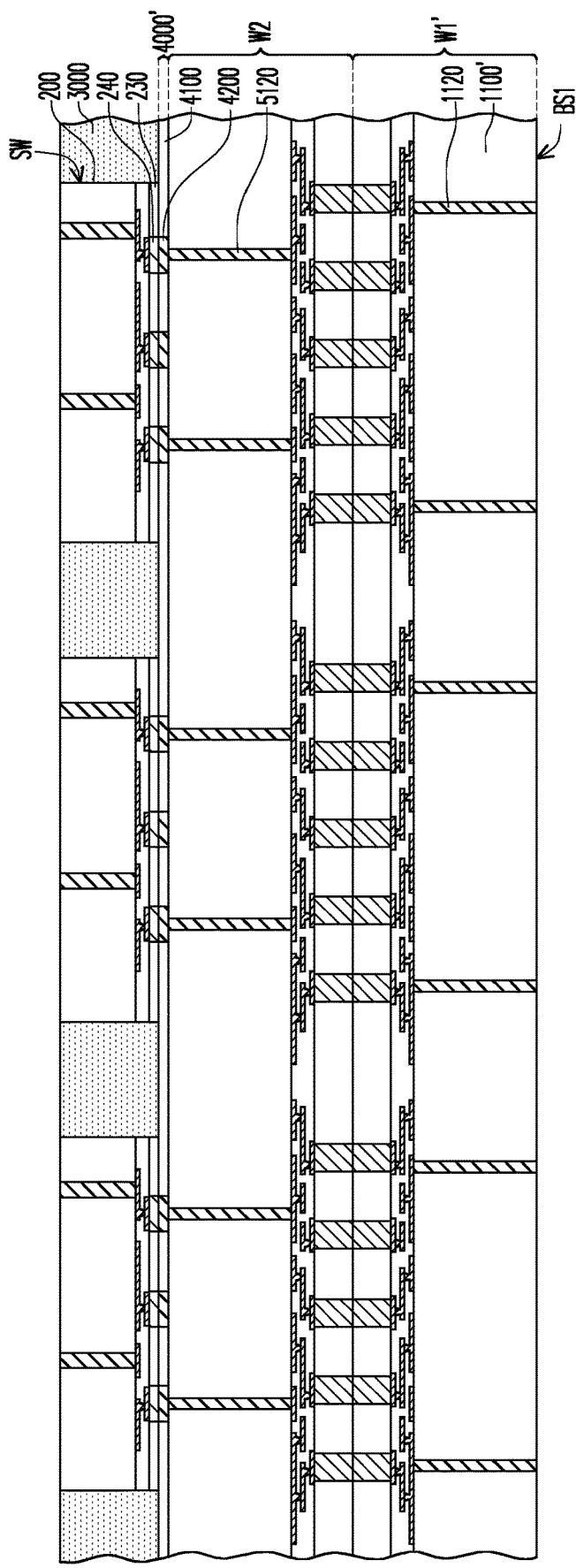

Referring to FIG. 20, a plurality of integrated circuit components 200 is bonded with the second semiconductor wafer W2 through the bonding layer 4000' and a dielectric encapsulation layer 3000 is formed over the second semiconductor wafer W2 to laterally encapsulate the integrated circuit components 200. The bonding process of the integrated circuit components 200 and the forming process of the dielectric encapsulation layer 3000 may be similar to the processes described in FIGS. 15 and 16, so the detailed descriptions are simplified for brevity. In some embodiments, the integrated circuit components 200 are bonded with the bonding layer 4000' using, for example, a hybrid bonding technique. The dielectric layers 230 of the integrated circuit components 200 and the dielectric layer 4100 of the bonding layer 4000' may be bonded with each other, while the die conductors 240 of the integrated circuit components 200 and the conductive features 4200 of the bonding layer 4000' are bonded together. The die conductors 240 of the integrated circuit components 200 are electrically connected to the second through semiconductor vias 5120 of the second semiconductor wafer W2 through the conductive features 4200 of the bonding layer 4000'. Subsequently, the dielectric encapsulation layer 3000 is formed over the bonding layer 4000' so that the dielectric encapsulation layer 3000 encapsulates the integrated circuit components 200 and also in contact with the dielectric layer 4100. In some embodiments, when reducing the thickness of the dielectric material layer 3000' (as shown in FIG. 2) to expose the through semiconductor vias 212 of the integrated circuit components 200, the first substrate 1100' may also be thinned until the first through semiconductor vias 1120 are revealed by the back surface BS1 of the first semiconductor wafer W1' for further electrical connection. In alternative embodiments, after forming the dielectric material layer 3000', the planarization process is skipped so that the dielectric material layer 3000' can protect the sidewalls SW and also the back side of the integrated circuit components 200.

Figure 21:
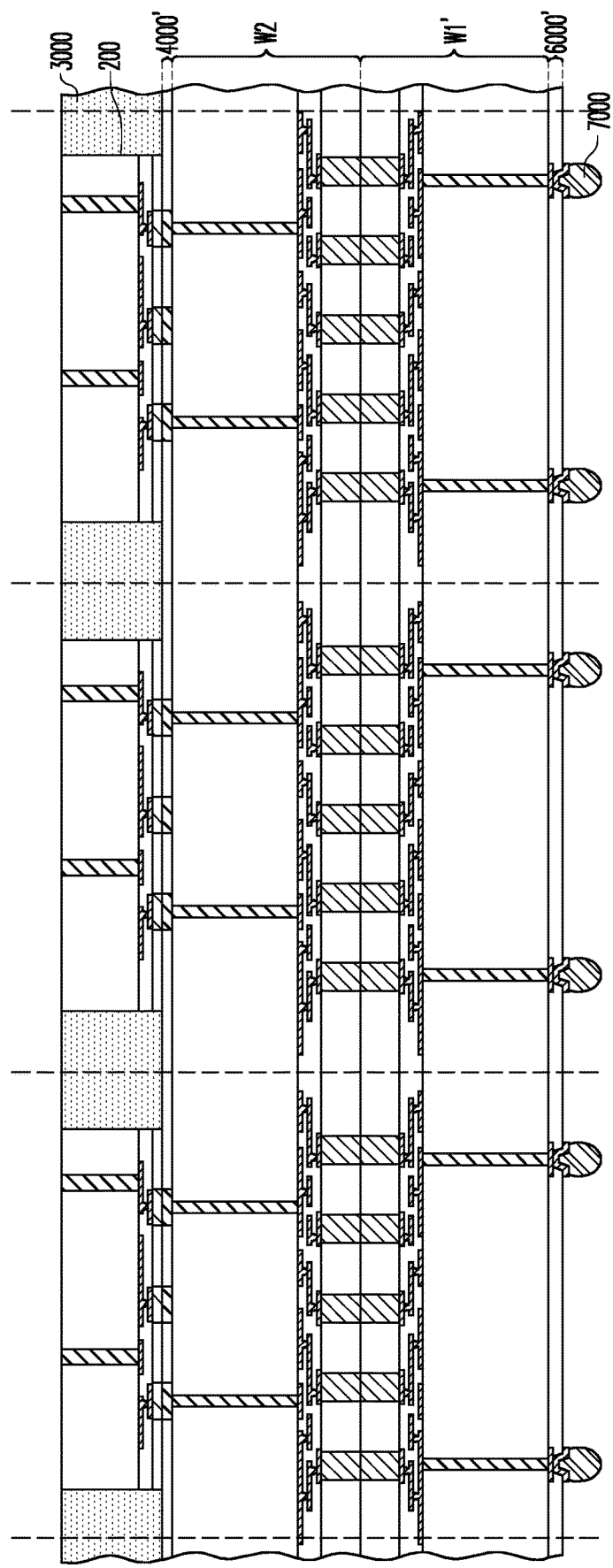

Referring to FIG. 21, after the first through semiconductor vias 1120 are revealed, the circuit structure 6000' and the I/O terminals 7000 are formed over the first semiconductor wafer W1'. The forming processes of the circuit structure 6000' and the I/O terminals 7000 may be similar to that of the circuit structure 6000' and the I/O terminals 7000 respectively described in FIG. 12, and the detailed descriptions are omitted for brevity. After formation, a singulation process may be performed on the structure along the scribe lines to obtain a plurality of semiconductor devices 10D (shown in FIG. 22).

Figure 22:
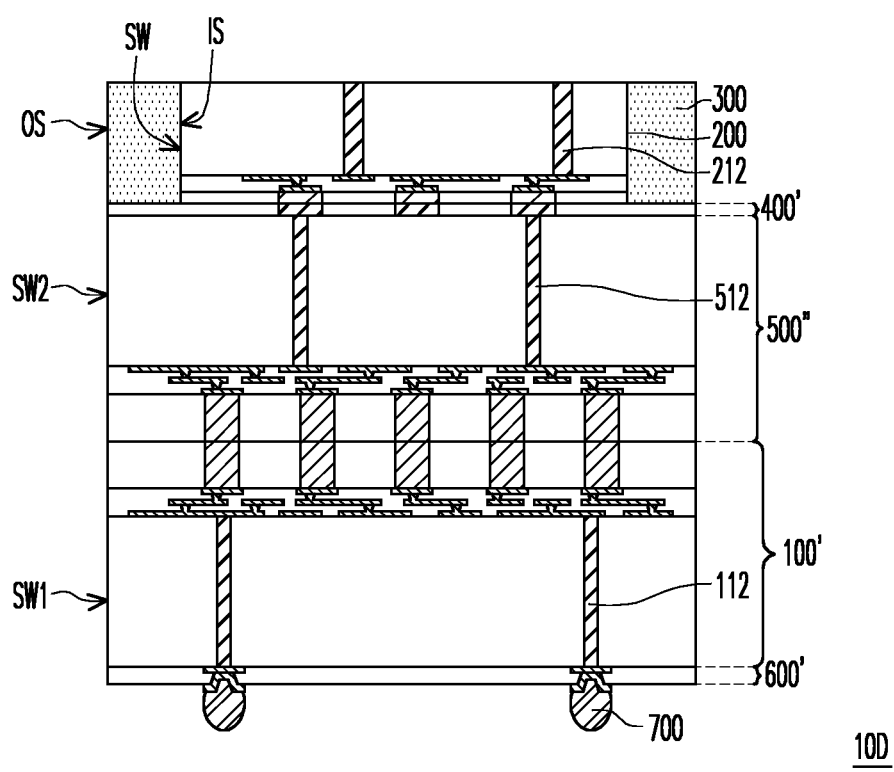

Referring to FIG. 22, the semiconductor device 10D includes a first integrated circuit component 100' (e.g., singulated from the first semiconductor wafer W1'), the second integrated circuit component 500" (e.g., singulated from the second semiconductor wafer W2') stacked on and electrically connected to the first integrated circuit component 100', an integrated circuit component 200 (i.e. third integrated circuit component) stacked on and electrically connected to the first integrated circuit component 100, a dielectric encapsulation 300 (e.g., singulated from the dielectric encapsulation layer 3000) disposed on the second integrated circuit component 500" and laterally encapsulating the integrated circuit component 200, a bonding layer 400' (e.g., singulated from the bonding layer 4000') disposed between the integrated circuit component 200 and a second integrated circuit component 500", a circuit layer 600' (e.g., singulated from the circuitry structure 6000') stacked on the first integrated circuit component 100' and electrically connected to the first through semiconductor vias 112 of the first integrated circuit component 100', and a plurality of I/O terminals 700 disposed on the circuit layer 600' and electrically connected to the first through semiconductor vias 112 of the first integrated circuit component 100' through the circuit layer 600'.

In some embodiments, the second integrated circuit component 500" is covered by the integrated circuit component 200 and the dielectric encapsulation 300. In some embodiments, the inner sidewalls IS of the dielectric encapsulation 300 are in contact with the sidewalls SW of the integrated circuit component 200, and the outer sidewalls OS of the dielectric encapsulation 300 are substantially aligned with the sidewalls SW1 of the first integrated circuit component and the sidewalls SW2 of the second integrated circuit component 500". In some embodiments, the first integrated circuit component 100' includes a plurality of first through semiconductor vias 112 and the second integrated circuit component 500" includes a plurality of second through semiconductor vias 512 electrically connected to the first through semiconductor vias 112. The integrated circuit component 200 may include a plurality of through semiconductor vias 212 electrically connected to the second through semiconductor vias 512. That is, each level of the integrated circuit components may include through semiconductor vias electrically connected to one another. It should be appreciated that the semiconductor device 10D can further be packaged to form a package-on-package (PoP) structure, system-in-package (SiP) structure, or other types of electronic applications using suitable packaging techniques. The applications of the semiconductor device 10D are not limited in the disclosure.

By employing hybrid bonding methods described herein, the semiconductor device (including multi-layered stacking structure or 3D IC structure) can be obtained with smaller size (e.g., reduced footprint and thickness), lesser weight, relatively easier assembly process, lower overall production costs, and improvement in electrical performance. The hybrid bonding methods described herein are compatible with various processes at different level (e.g., wafer-to-wafer level, die-to-wafer level, die-to-die level, etc.) and materials. In some embodiments, by planarizing the dielectric material layer and the rear surfaces of the integrated circuit components, negative impacts of topography created in the multi-level wafer fabrication process can be eliminated so as to render a planarized surface with minimal layer thickness variation for further stacking/bonding processes. In some embodiments, since the inner sidewalls of the dielectric encapsulation are in direct contact with the sidewalls of the integrated circuit component (e.g., 200 labeled in FIG. 7), the sidewalls of the integrated circuit component are well protected from external impacts.

In accordance with some embodiments of the disclosure, a semiconductor device including a first integrated circuit component, a second integrated circuit component, a third integrated circuit component, and a dielectric encapsulation is provided. The second integrated circuit component is stacked on and electrically coupled to the first integrated circuit component, and the third integrated circuit component is stacked on and electrically coupled to the second integrated circuit component. The dielectric encapsulation is disposed on the second integrated circuit component and laterally encapsulating the third integrated circuit component, where outer sidewalls of the dielectric encapsulation are substantially aligned with sidewalls of the first and second integrated circuit components.

In accordance with some embodiments of the disclosure, a semiconductor device including a first integrated circuit component, a second integrated circuit component, a third integrated circuit component, and a dielectric encapsulation is provided. The first integrated circuit component includes a first bonding structure. The second integrated circuit component is stacked on and electrically coupled to the first integrated circuit component, the second integrated circuit component includes a second bonding structure bonded to the first bonding structure, where each of the first bonding structure and the second bonding structure includes a plurality of first conductive features laterally covered by a first dielectric layer, and bonding surfaces of the first conductive features are substantially leveled with a bonding surface of the first dielectric layer. The third integrated circuit component is stacked on and electrically coupled to the second integrated circuit component, and the dielectric encapsulation is disposed on the third bonding structure of the second integrated circuit component and extends along a sidewall of the third integrated circuit component.

In accordance with some embodiments of the disclosure, a manufacturing method of a semiconductor device includes at least the following steps. A second semiconductor wafer is bonded to a first semiconductor wafer. A plurality of top integrated circuit components is bonded to the second semiconductor wafer. A dielectric material layer is formed on the second semiconductor wafer to cover the top integrated circuit components. A singulation process is performed to cut off the dielectric material layer, the second semiconductor wafer, and the first semiconductor wafer to form a dielectric encapsulation, a middle integrated circuit component underlying the dielectric encapsulation, and a bottom integrated circuit component underlying the middle integrated circuit component, where outer sidewalls of the dielectric encapsulation are substantially aligned with sidewalls of the middle and bottom integrated circuit components.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first integrated circuit component;
   a second integrated circuit component stacked on and electrically coupled to the first integrated circuit component, wherein the first integrated circuit component is in contact with the second integrated circuit component;
   a third integrated circuit component stacked on and electrically coupled to the second integrated circuit component; and
   a dielectric encapsulation disposed on the second integrated circuit component and laterally encapsulating the third integrated circuit component, wherein outer sidewalls of the dielectric encapsulation are substantially aligned with sidewalls of the first and second integrated circuit components.

2. The semiconductor device as claimed in claim 1, wherein:
   the first integrated circuit component comprises a plurality of first conductive connectors laterally covered by a first dielectric layer,
   the second integrated circuit component comprises a plurality of second conductive connectors laterally covered by a second dielectric layer, and
   each of the first conductive connectors is bonded to one of the second conductive connectors, and the first dielectric layer is bonded to the second dielectric layer.

3. The semiconductor device as claimed in claim 2, wherein:
   a bonding surface of the first dielectric layer is substantially leveled with bonding surfaces of the first conductive connectors, and
   a bonding surface of the second dielectric layer is substantially leveled with bonding surfaces of the second conductive connectors.

4. The semiconductor device as claimed in claim 1, wherein the second integrated circuit component comprises:
   a semiconductor substrate;
   a plurality of through semiconductor vias penetrating through the semiconductor substrate;
   a first bonding structure disposed below the semiconductor substrate and electrically coupled to the first integrated circuit component;
   an interconnect structure interposed between the semiconductor substrate and the first bonding structure, the interconnect structure being electrically coupled to the through semiconductor vias and the first bonding structure; and
   a second bonding structure disposed over the semiconductor substrate and electrically coupled to the third integrated circuit component.

5. The semiconductor device as claimed in claim 4, wherein the second bonding structure of the second integrated circuit component comprises:
   a plurality of conductive features disposed over the semiconductor substrate, the conductive features being electrically coupled to the through semiconductor vias and the third integrated circuit component; and
   a dielectric layer disposed over the semiconductor substrate and laterally covering the conductive features, wherein the dielectric encapsulation is in direct contact with the dielectric layer.

6. The semiconductor device as claimed in claim 1, wherein the third integrated circuit component comprises:
   a semiconductor substrate;
   a bonding structure bonded to the second integrated circuit component and comprising a substantially flat bonding surface; and
   an interconnect structure interposed between the semiconductor substrate and the bonding structure, the interconnect structure being electrically coupled to the bonding structure.

7. The semiconductor device as claimed in claim 6, wherein:
   the third integrated circuit component further comprises a plurality of through semiconductor vias penetrating through the semiconductor substrate and electrically coupled to the bonding structure, and
   the semiconductor device further comprises a plurality of input/output terminals disposed on the semiconductor substrate of the third integrated circuit component and electrically coupled to the through semiconductor vias of the third integrated circuit component.

8. The semiconductor device as claimed in claim 6, wherein the substantially flat bonding surface of the bonding structure of the third integrated circuit component is bonded to a portion of a bonding surface of the second integrated circuit component, and a rest portion of the bonding surface of the second integrated circuit component is physically bonded to the dielectric encapsulation.

9. The semiconductor device as claimed in claim 1, wherein:
   the first integrated circuit component comprises a semiconductor substrate and a plurality of through semiconductor vias penetrating through the semiconductor substrate, and
   the semiconductor device further comprises a plurality of input/output terminals disposed below the semiconductor substrate of the first integrated circuit component and electrically coupled to the through semiconductor vias of the first integrated circuit component.

10. A semiconductor device, comprising:
    a first integrated circuit component comprising a first bonding structure;
    a second integrated circuit component stacked on and electrically coupled to the first integrated circuit component, the second integrated circuit component comprising a second bonding structure bonded to the first bonding structure, wherein each of the first bonding structure and the second bonding structure comprises a plurality of first conductive features laterally covered by a first dielectric layer, and bonding surfaces of the first conductive features are substantially leveled with a bonding surface of the first dielectric layer;
    a third integrated circuit component stacked on and electrically coupled to the second integrated circuit component; and
    a dielectric encapsulation disposed on a third bonding structure of the second integrated circuit component and extending along a sidewall of the third integrated circuit component.

11. The semiconductor device as claimed in claim 10, wherein outer sidewalls of the dielectric encapsulation are substantially leveled with sidewalls of the first and second integrated circuit components.

12. The semiconductor device as claimed in claim 10, wherein:
    the third bonding structure is disposed above the second bonding structure, and
    the third integrated circuit component comprises a fourth bonding structure bonded to the third bonding structure, wherein each of the third bonding structure and the fourth bonding structure comprises a plurality of second conductive features laterally covered by a second dielectric layer, and bonding surfaces of the second conductive features are substantially leveled with a bonding surface of the second dielectric layer.

13. The semiconductor device as claimed in claim 10, wherein:
the first integrated circuit component comprises a first semiconductor substrate and a first interconnect structure disposed on the first semiconductor substrate, and the first bonding structure is disposed on and electrically coupled to the first interconnect structure, and
the second integrated circuit component comprises a second semiconductor substrate and a second interconnect structure disposed below the second semiconductor substrate, and the second bonding structure bonded to the first bonding structure is disposed below and electrically coupled to the second interconnect structure.

14. The semiconductor device as claimed in claim 13, wherein:
the second integrated circuit component further comprises a plurality of through semiconductor vias penetrating through the second semiconductor substrate and electrically connecting the second interconnect structure to the third integrated circuit component.

15. The semiconductor device as claimed in claim 10, wherein:
the third integrated circuit component comprises a third semiconductor substrate, a third interconnect structure disposed below the third semiconductor substrate, and a plurality of through semiconductor vias penetrating through the third semiconductor substrate, and
the semiconductor device further comprises a plurality of input/output terminals disposed over the third semiconductor substrate of the third integrated circuit component and electrically coupled to the through semiconductor vias.

16. The semiconductor device as claimed in claim 10, further comprising:
a plurality of input/output terminals disposed below and electrically coupled to the first integrated circuit component.

17. A manufacturing method of a semiconductor device, comprising:
bonding a second semiconductor wafer to a first semiconductor wafer;
bonding a plurality of top integrated circuit components to the second semiconductor wafer;
forming a dielectric material layer on the second semiconductor wafer to cover the top integrated circuit components; and
performing a singulation process to cut off the dielectric material layer, the second semiconductor wafer, and the first semiconductor wafer to form a dielectric encapsulation, a middle integrated circuit component underlying the dielectric encapsulation, and a bottom integrated circuit component underlying the middle integrated circuit component, wherein outer sidewalls of the dielectric encapsulation are substantially aligned with sidewalls of the middle and bottom integrated circuit components, wherein the bottom integrated circuit component is in contact with the middle integrated circuit component.

18. The manufacturing method as claimed in claim 17, wherein bonding the second semiconductor wafer to the first semiconductor wafer comprises:
aligning a bonding surface of the second semiconductor wafer to a bonding surface of the first semiconductor wafer, wherein the bonding surfaces of the first and second semiconductor wafers are substantially flat; and
bonding conductive features on the bonding surfaces of the first and second semiconductor wafers.

19. The manufacturing method as claimed in claim 17, further comprising:
forming a plurality of input/output terminals on the top integrated circuit components to be electrically coupled to through semiconductor vias of the top integrated circuit components before performing the singulation process.

20. The manufacturing method as claimed in claim 17, further comprising:
performing a back-side removal process to reveal through semiconductor vias of the first semiconductor wafer; and
forming a plurality of input/output terminals on the first semiconductor wafer to be electrically coupled to the through semiconductor vias of the first semiconductor wafer before performing the singulation process.

* * * * *